(12) United States Patent  
Pachoud et al.

(10) Patent No.: US 11,664,677 B2  
(45) Date of Patent: May 30, 2023

(54) INTELLIGENT AUTOMATIC TRANSFER SWITCH MODULE

(71) Applicant: Zonit Structured Solutions, LLC, Boulder, CO (US)

(72) Inventors: William Pachoud, Boulder, CO (US); Steve Chapel, Iliff, CO (US)

(73) Assignee: ZONIT STRUCTURED SOLUTIONS, LLC, Boulder, CO (US)

( * ) Notice: Subject to any disclaimer, the term of this patent is extended or adjusted under 35 U.S.C. 154(b) by 0 days.

(21) Appl. No.: 16/824,554

(22) Filed: Mar. 19, 2020

(65) Prior Publication Data

US 2021/0013735 A1 Jan. 14, 2021

Related U.S. Application Data

(60) Provisional application No. 62/820,726, filed on Mar. 19, 2019.

(51) Int. Cl.
*H02J 9/06* (2006.01)
*H02J 13/00* (2006.01)
(Continued)

(52) U.S. Cl.
CPC ............. *H02J 9/068* (2020.01); *G06F 1/189* (2013.01); *G06F 1/26* (2013.01); *H01H 33/121* (2013.01);
(Continued)

(58) Field of Classification Search
CPC ............. H02J 9/068; H02J 13/00006; H02J 13/00002; H02J 9/062; H01H 47/002;
(Continued)

(56) References Cited

U.S. PATENT DOCUMENTS 4,721,475 A 1/1988 Burke et al.
5,507,664 A 4/1996 Carmo
(Continued)

FOREIGN PATENT DOCUMENTS

CN 112136369 A 12/2020
EP 2483977 8/2012
(Continued)

OTHER PUBLICATIONS

International Search Report and Written Opinion issued in co-pending International Application No. PCT/US2019/021936, Korean Intellectual Property Office, dated Aug. 2, 2019, 13 pages.

(Continued)

*Primary Examiner* — Rexford N Barnie
*Assistant Examiner* — Thai H Tran
(74) *Attorney, Agent, or Firm* — Davis Graham & Stubbs LLP

(57) ABSTRACT

An automatic transfer switch (100) for automatically switching an electrical load between two power sources is provided. Two power cords (106) enter the ATS (A power and B power inputs) and one cord (109) exits the ATS (power out to the load). The ATS has indicators (107) located beneath a clear crenelated plastic lens (108) that also acts as the air inlets. The ATS (100) also has a communication portal (103) and a small push-button (104) used for inputting some local control commands directly to the ATS (100). The ATS (100) can be mounted on a DIN rail at a rack and avoids occupying rack shelves.

32 Claims, 29 Drawing Sheets

(51) Int. Cl.
  *H01H 47/00* (2006.01)
  *G06F 1/18* (2006.01)
  *G06F 1/26* (2006.01)
  *H01H 33/12* (2006.01)
  *H02J 1/14* (2006.01)
  *H05K 7/14* (2006.01)
(52) U.S. Cl.
  CPC .............. *H01H 47/002* (2013.01); *H02J 1/14* (2013.01); *H02J 9/06* (2013.01); *H02J 9/062* (2013.01); *H02J 13/00002* (2020.01); *H02J 13/00006* (2020.01); *H05K 7/1492* (2013.01); *H01H 2300/018* (2013.01)
(58) Field of Classification Search
  CPC ... H01H 2300/018; Y02E 60/00; Y04S 10/30; Y04S 40/12; Y04S 20/12; Y02B 90/20; G06F 1/263; G06F 1/30
  See application file for complete search history.

(56) References Cited

U.S. PATENT DOCUMENTS

| | | |
|---|---|---|
| 6,341,972 B1 | 1/2002 | Odorfer |
| 6,628,009 B1 | 9/2003 | Chapel |
| 7,172,451 B1 | 2/2007 | Ratzlaff |
| 7,553,181 B1 | 6/2009 | Van Dalinda |
| 8,004,115 B2 | 8/2011 | Chapel et al. |
| 8,152,554 B2 | 4/2012 | Chapel et al. |
| 8,174,149 B2 | 5/2012 | Chapel et al. |
| 8,374,729 B2 | 2/2013 | Chapel et al. |
| 8,453,471 B2 | 6/2013 | Chapel et al. |
| 8,476,540 B2 | 7/2013 | Dahl et al. |
| 8,729,730 B2 * | 5/2014 | Lathrop ............... H02J 9/061 307/64 |
| 8,907,520 B2 | 12/2014 | Chapel et al. |
| 9,065,207 B2 | 6/2015 | Chapel et al. |
| 9,081,568 B1 | 7/2015 | Ross et al. |
| 9,160,168 B2 | 10/2015 | Chapel et al. |
| 9,281,617 B2 | 3/2016 | Reaves et al. |
| 9,431,763 B2 | 8/2016 | Chapel et al. |
| 9,588,534 B2 | 3/2017 | Chapel et al. |
| 9,601,284 B2 | 3/2017 | Chapel et al. |
| 9,618,270 B2 | 4/2017 | Chapel et al. |
| 9,646,789 B2 | 5/2017 | Chapel et al. |
| 9,658,665 B2 | 5/2017 | Chapel et al. |
| 9,793,887 B2 | 10/2017 | Chapel et al. |
| 9,829,960 B2 | 11/2017 | Pachoud et al. |
| 9,918,413 B2 | 3/2018 | Chapel et al. |
| 9,935,495 B2 | 4/2018 | Thurk et al. |
| 9,958,925 B2 | 5/2018 | Chapel et al. |
| 9,996,128 B2 | 6/2018 | Chapel et al. |
| 9,997,957 B2 | 6/2018 | Chapel et al. |
| 10,034,406 B2 | 7/2018 | Chapel et al. |
| 10,050,441 B2 | 8/2018 | Chapel et al. |
| 10,068,730 B2 | 9/2018 | Chapel et al. |
| 10,209,727 B2 | 2/2019 | Chapel et al. |
| 10,297,958 B2 | 5/2019 | Chapel et al. |
| 10,326,240 B2 | 6/2019 | Chapel et al. |
| 10,361,050 B2 | 7/2019 | Chapel et al. |
| 10,474,220 B2 | 11/2019 | Pachoud et al. |
| 10,673,429 B2 | 6/2020 | Chapel et al. |
| 10,698,469 B2 | 6/2020 | Chapel et al. |
| 10,945,351 B2 | 3/2021 | Chapel et al. |
| 11,085,714 B2 | 8/2021 | Doll et al. |
| 2003/0117761 A1 | 6/2003 | Pebles et al. |
| 2008/0236863 A1 | 10/2008 | King et al. |
| 2008/0258556 A1* | 10/2008 | Ewing ................. H01H 33/121 307/23 |
| 2008/0313006 A1* | 12/2008 | Witter ............... H02J 13/00017 705/7.17 |
| 2010/0068913 A1 | 3/2010 | Edge et al. |
| 2010/0141038 A1 | 6/2010 | Chapel et al. |
| 2010/0197156 A1 | 8/2010 | Chen |
| 2011/0169531 A1* | 7/2011 | Scholder ............. H03K 5/1536 327/79 |
| 2011/0207362 A1 | 8/2011 | Lifson |
| 2012/0092811 A1 | 4/2012 | Chapel et al. |
| 2012/0095610 A1 | 4/2012 | Chapel et al. |
| 2012/0204418 A1 | 8/2012 | van Beveren et al. |
| 2013/0093249 A1 | 4/2013 | Chapel et al. |
| 2014/0025221 A1 | 1/2014 | Chapel et al. |
| 2015/0200509 A1 | 7/2015 | Chapel et al. |
| 2016/0118802 A1 | 4/2016 | Castillo et al. |
| 2016/0195911 A1 | 7/2016 | Chapel et al. |
| 2017/0005510 A1* | 1/2017 | Rohr ..................... H02J 9/061 |
| 2017/0207576 A1 | 7/2017 | Chapel et al. |
| 2017/0308109 A1 | 10/2017 | Chapel et al. |
| 2018/0278086 A1* | 9/2018 | Hall ..................... H02J 3/0073 |
| 2018/0375268 A1 | 12/2018 | Chapel et al. |
| 2020/0303862 A1 | 9/2020 | Pachoud et al. |
| 2021/0006020 A1 | 1/2021 | Pachoud et al. |
| 2021/0013735 A1 | 1/2021 | Pachoud et al. |
| 2021/0313827 A1 | 10/2021 | Pachoud et al. |

FOREIGN PATENT DOCUMENTS

| | | |
|---|---|---|
| EP | 2973881 | 1/2016 |
| EP | 2973881 B1 | 4/2018 |
| EP | 3766315 A1 | 1/2021 |
| JP | H06181078 A | 6/1994 |
| JP | 4152242 | 9/2008 |
| JP | 4152242 B2 | 9/2008 |
| WO | 2008113047 | 9/2009 |
| WO | 2009120880 | 10/2009 |
| WO | 2014134218 | 9/2014 |
| WO | 2015148686 | 10/2015 |

OTHER PUBLICATIONS

U.S. Appl. No. 12/531,212, by Chapel, filed Sep. 14, 2009.
U.S. Appl. No. 12/531,235, by Chapel et al., filed Sep. 14, 2009.
U.S. Appl. No. 12/531,240, by Chapel, filed Sep. 14, 2009.
U.S. Appl. No. 12/891,500, by Chapel et al., filed Sep. 27, 2010.
U.S. Appl. No. 12/892,009, by Chapel et al., filed Sep. 28, 2010.
U.S. Appl. No. 15/064,368, by Chapel et al., filed Mar. 8, 2016.
U.S. Appl. No. 16/831,513, by Pachoud et al., filed Mar. 26, 2020.
International Search Report and Written Opinion issued in International Application No. PCT/US2020/023726 dated Jul. 17, 2020, 13 pp.
Prosecution History of U.S. Appl. No. 16/827,626 dated Jul. 22, 2021 through Oct. 22, 2021, 14 pp.

* cited by examiner

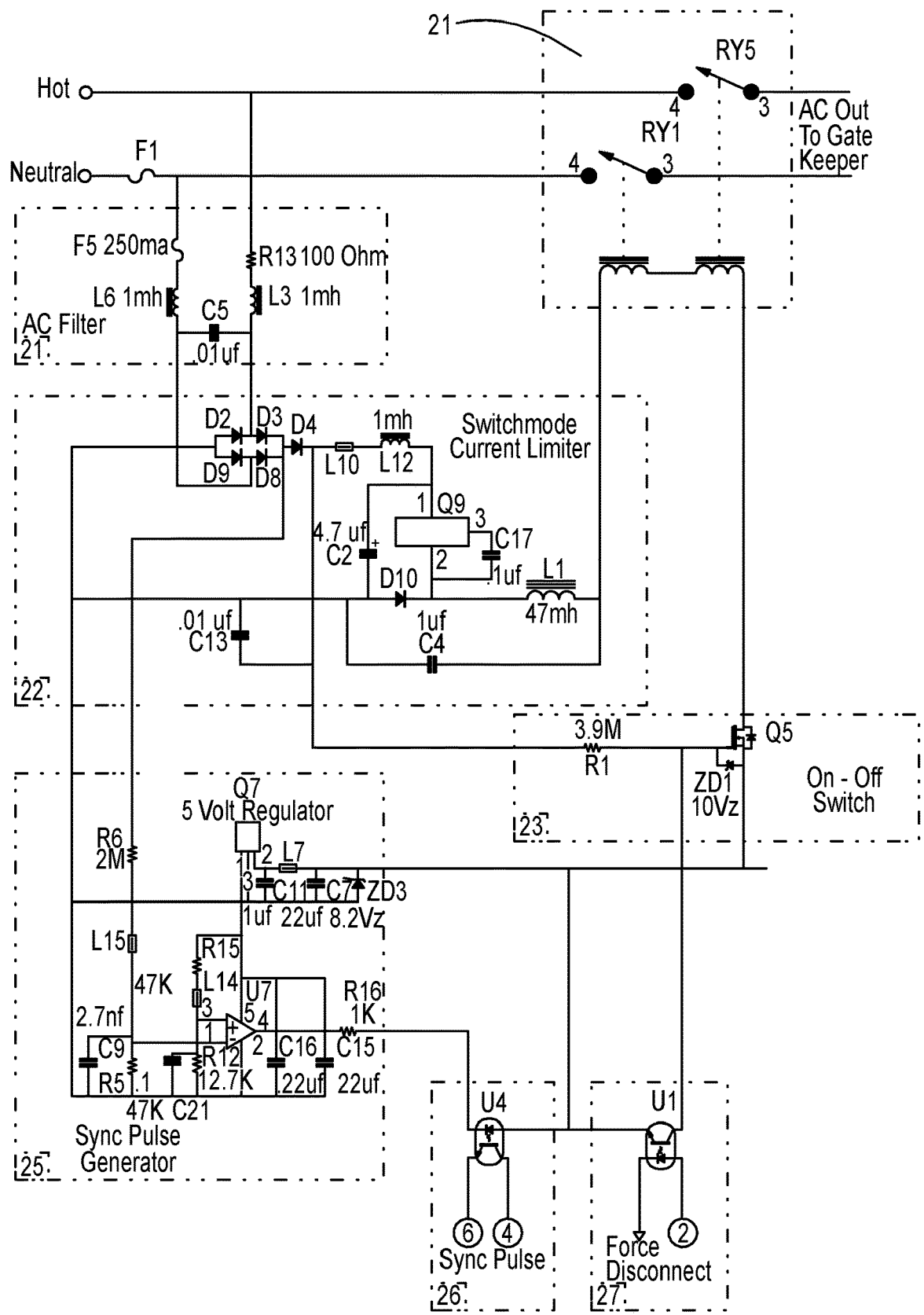
Figure 2-A

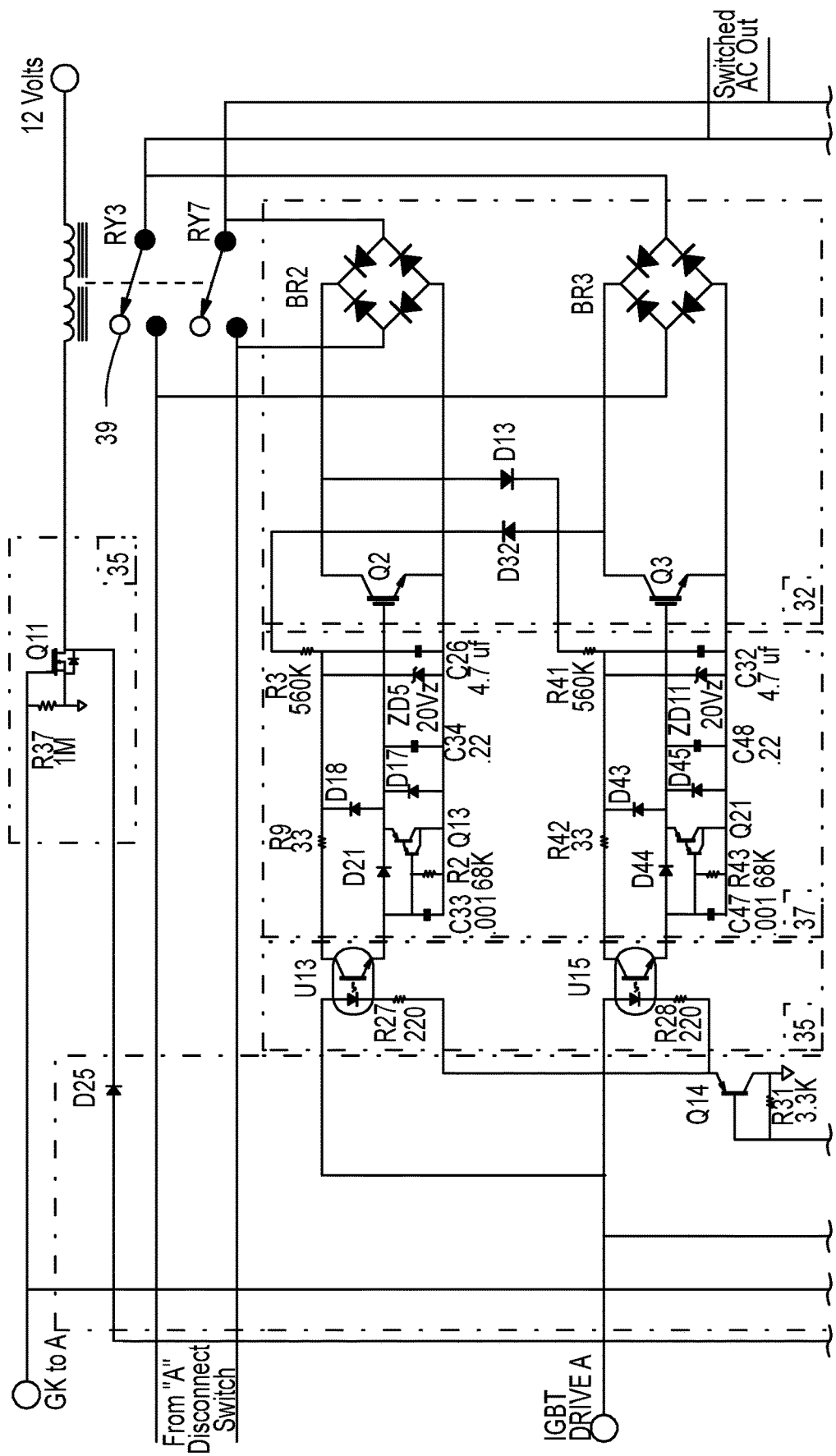
Figure 3-A

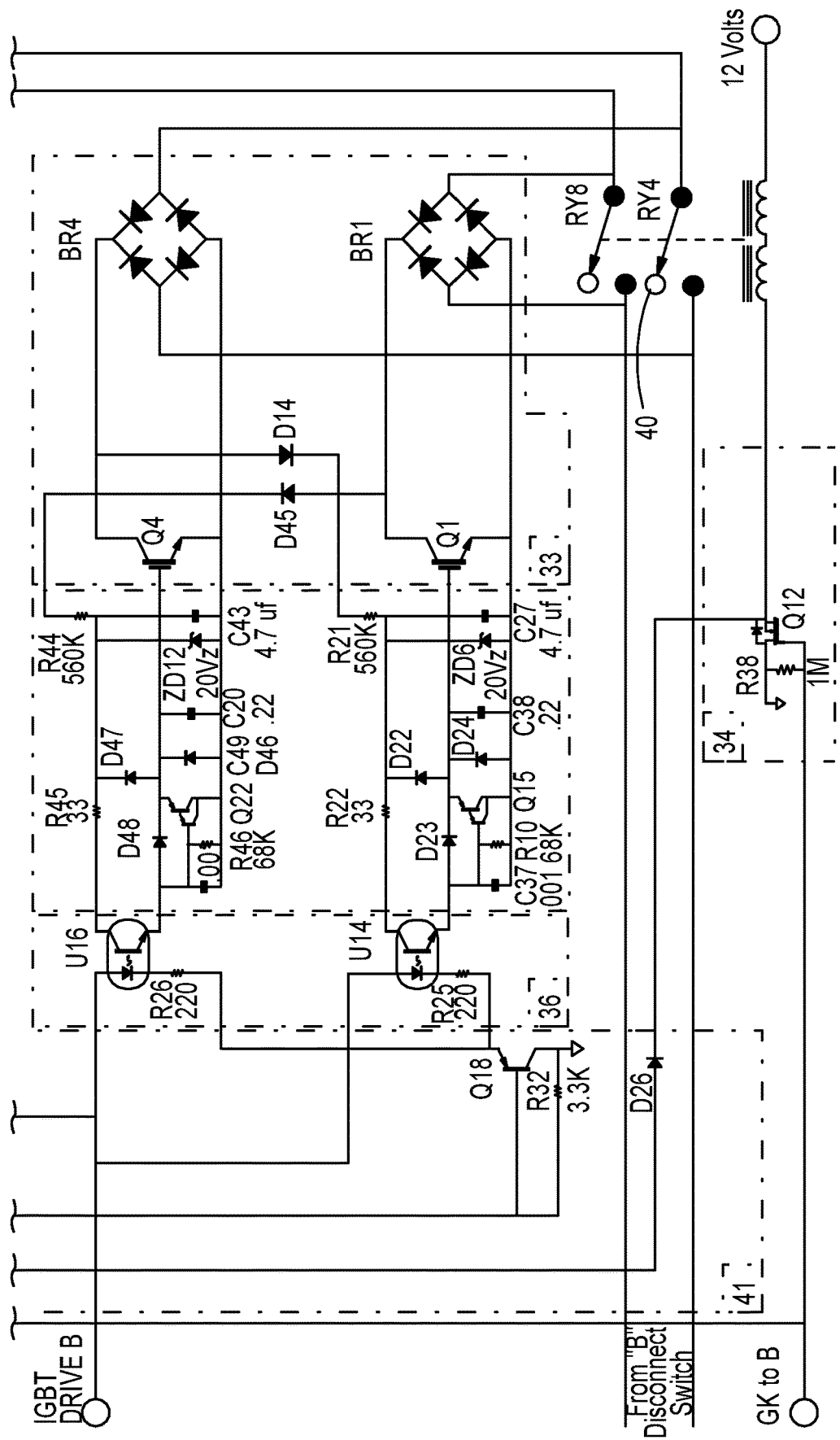
Figure 3-A continued

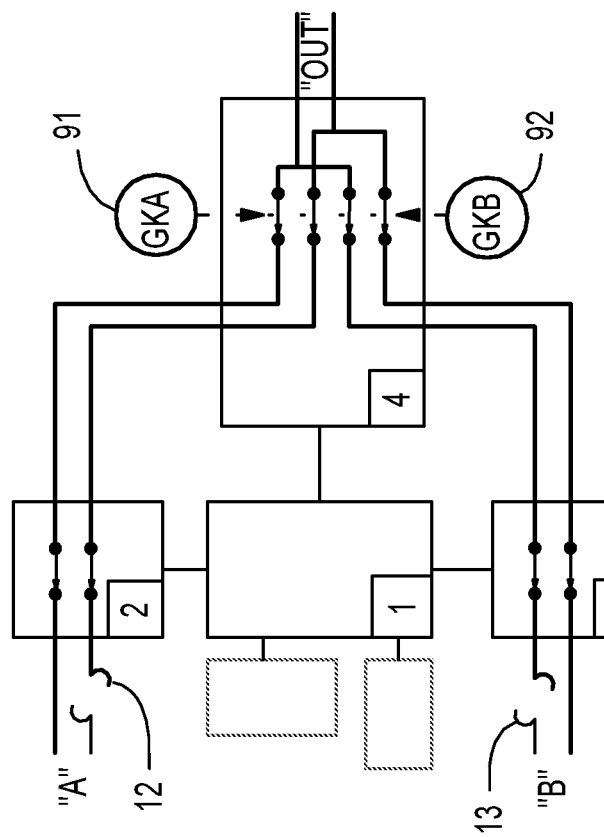
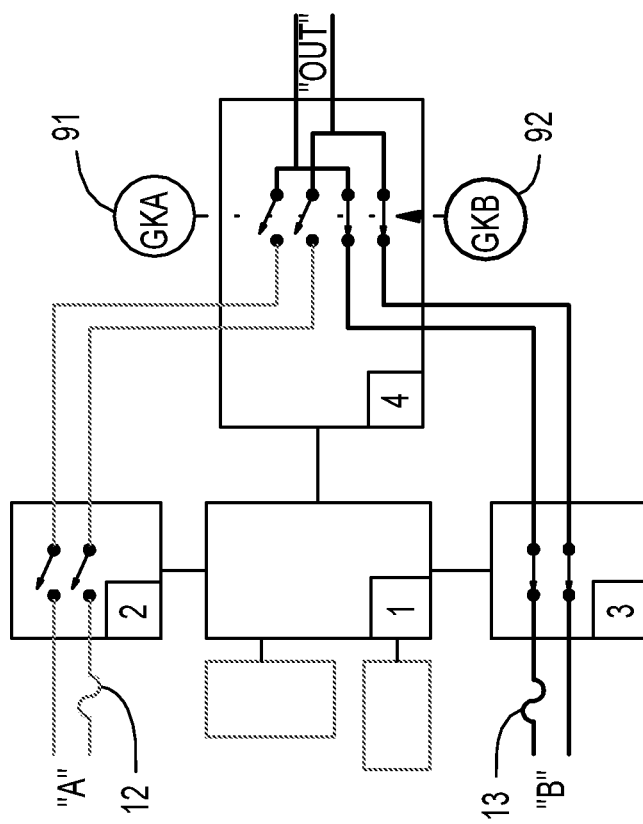
Figure 7c
Figure 7d

Arrowhead - 60
24 C-13s, 1U

INTELLIGENT AUTOMATIC TRANSFER SWITCH MODULE

CROSS-REFERENCE TO RELATED APPLICATIONS

This application claims priority to U.S. patent application Ser. No. 16/351,431, entitled, "MANAGEMENT MODULE, Z-STRIP, AND MINI-ATS SYSTEMS AND RELATED COMPONENTS," filed on Mar. 12, 2019, which claims priority from U.S. Provisional Application No. 62/641,943, entitled, "POWER DISTRIBUTION USING HYDRA CABLE SYSTEMS," filed on Mar. 12, 2018, and U.S. Provisional Application No. 62/641,929, entitled, "MANAGEMENT MODULE, Z-STRIP, AND MINI-ATS SYSTEMS AND RELATED COMPONENTS," filed on Mar. 12, 2018. This Application also claims priority to U.S. patent application Ser. No. 16/351,343, entitled, "POWER DISTRIBUTION USING HYDRA CABLE SYSTEMS," filed on Mar. 12, 2019, and PCT Application No. PCT/US2019/021936, entitled, "MANAGEMENT MODULE, Z-STRIP, AND MINI-ATS SYSTEMS AND RELATED COMPONENTS," filed on Mar. 12, 2019. The contents of the above-noted applications (collectively, the "parent applications") are incorporated by reference herein as if set forth in full and priority to these applications are claimed to the full extent allowable under U.S. law and regulations.

INCORPORATION BY REFERENCE

The systems, components and processes described herein build on and can be combined with a number of technologies of Zonit Structural Solutions (Zonit) to yield synergies or combinative advantages such as improved efficiency of rack space, reduced rack size for a given payload of equipment, enhanced functionality, enhanced networking and monitoring of equipment, reduced equipment requirements and costs, and others. Accordingly, reference is made at various points in the description to one or more of the following families of U.S. cases (patents and applications) of Zonit (it is intended to reference all related U.S. application and patents in each family that are available to be incorporated by reference), all of which are incorporated by reference herein in their entireties.

1. U.S. Pat. Appl. Serial Nos. 60/894,842; 12/049,130; 12/531,212; 12/569,733 (the ATS cases);
2. U.S. Pat. Appl. Serial Nos. 60/894,844; 12/531,215; 13/889,181; 15/353,590; 14/217,225 (the Z-cool cases);
3. U.S. Pat. Appl. Serial Nos. 60/894,846; 12/531,226; 12/569,377; 13/757,156; 13/763,480; 14/717,899; 15/655,620; 15/656,229 (the Smart Outlets cases);
4. U.S. Pat. Appl. Serial Nos. 60/894,848; 12/531,231; 12/569,745; 13/466,950; 14/249,151; 13/208,333; 14/191,339; 14/564,489; 15/603,217; 15/797,756; 61/970,267; 61/372,752; 61/372,756; 13/208,333; 61/769,688; 14/191,339; 14/564,489; 15/603,217; 15/797,756 (the Auto-Switching cases);
5. U.S. Pat. Appl. Serial Nos. 61/324,557; 13/088,234; 14/217,278; 15/250,523; 15/914,877; 60/894,849; 12/531,235; 12/568,444; 13/228,331; 61/610,183; 61/619,137; 61/799,971; 61/944,506; 15/064,368; 15/332,878 (the Locking Receptacle cases);
6. U.S. Pat. Appl. Serial Nos. 60/894,850; 12/531,240; 12/569,609; 14/470,691; 15/673,153 (the NetStrip cases);
7. U.S. Pat. Appl. Serial Nos. 61/039,716; 12/891,500; 13/108,824; 14/217,204; 14/680,802; 15/450,281 (the Power Distribution Methodology cases);
8. U.S. Pat. Appl. Serial Nos. 61/040,542; 12/892,009; 13/108,838; 14/327,212 (the UCAB cases);
9. U.S. patent application Ser. No. 09/680,670 (the ZPDS case);
10. U.S. patent application Ser. Nos. 14/217,159; 15/452,917; 14/217,172; 15/425,831; 14/217,179; 15/706,368 (the Relay cases);

The parent cases together with the other cases noted above are occasionally referred to collectively herein as the Zonit cases.

BACKGROUND

Electronic data processing (EDP) equipment, such as servers, storage devices, or the like, are often fed by alternating current (AC) power sources in a data center and require very high reliability. For this reason, this equipment is generally fed by one or more uninterruptible power sources (UPS). When redundant power sources (e.g., A and B power sources) are supplied in a data center, the data center manager must manage the provisioning and capacity demand for both of the sources. The provisioning must be done so that if either of the two sources fails, the remaining power source has sufficient power capacity to carry the total load of the equipment. However, the complexity of delivering power from a UPS to the equipment often creates numerous possibilities for interruption. For example, power distribution circuits, interim circuit breakers, plugboards, power whips, power distribution units (PDUs), power strips, power cords, non-locking or locking and other distribution elements are often placed in the circuit path between large UPS systems and the EDP equipment. These components increase the probability of an interruption or disconnection of the equipment from the power sources. EDP equipment may contain a dual power supply arrangement that can provide direct current (DC) power to the internal circuits of the equipment from two separate AC sources. Also, UPS systems and other power distribution components need maintenance which may require that they be taken out of service.

In this arrangement, the failure of one of the AC sources will result in the equipment load being supplied from the alternate DC power supply in the unit. At times when both AC sources are present, the load is either shared by both power supplies, or favored to one of the power supplies. These systems, sometimes referred to as "redundant supplied" systems, may be a final line of defense for reliable power delivery to the electronic circuits within the equipment. However, these solutions may be costly due to the additional power supplies that may be required. Further, the added components generate more heat, which is undesirable in many applications. Alternatively, EDP equipment may include only one power supply and one AC power input. In this configuration, the equipment is subject to the failure of the single AC source. Further, additional components such as Automatic Transfer Switches to address this vulnerability may require rack space, which is costly.

Aggregating a plurality of such affected EDP equipment onto a multiple outlet power distribution unit (PDU) and powering that PDU from a switching apparatus such as an Automatic Transfer Switch (ATS) that selects from the available power sources (e.g. A or B) is an alternative means of delivering redundant power to said EDP equipment while reducing the number of power supplies, cords, etc. It may be a superior method due to cost and efficiency for many deployment scenarios, such as large server farms for example.

In another application, many industrial devices starting in the 1960's have incorporated intelligent control modules using digital processing components for example one or more single chip microcontrollers (MCU) or other digital processing components. The Intel 8051 is a famous and widely used example of this type of component. These components have gained greatly in computing power and capability, accelerated by the cell phone revolution which for example uses many ARM-32 & ARM-64 MCU components. The increase in computing power of these components has allowed significant increases in the complexity and capability of the programming logic they execute. Insuring that intelligent control modules have maximum uptime delivers many benefits. Many failures of long-service time modules occur at power-up. So, avoiding unnecessary reboot or restart cycles improves reliability. Many software algorithms used with control modules "learn" as runtime increases and some or all of that learning may be lost when the module is rebooted due to power distribution maintenance, UPS maintenance, UPS failure or a power source failure. The use of an appropriate ATS unit in the power path to the intelligent control module(s) in these industrial devices can eliminate these potential problems and maximize uptime.

It should be realized that laptop/desktop/server computers, single board computers (SBC), system-on-a-chip (SOC), Microcontroller units (MCUs), and other similar components that are all essentially digital devices capable of executing programs. Further SBC units, SOC, MCU and other similar digital processing components are rarely built into computing devices that are designed with dual power supplies. All of these computing devices can run programs that can benefit from improved uptime, by appropriately using appropriate Automatic Transfer Switch units as described herein. The uptime benefits are obvious for any digital processing device with a single power supply, but also can benefit digital processing devices that have dual power supplies.

It is against this background that the automatic transfer switch module described herein has been developed.

SUMMARY

The following embodiments and aspects of the invention herein are described and illustrated in conjunction with systems, tools, and methods which are meant to be exemplary and illustrative, and not limiting in scope.

In accordance with one instantiation of the current invention, an automatic transfer switch for automatically switching an electrical load between two power sources is provided. The automatic transfer switch includes a switch module, and primary and secondary input cords, each attached to the switch module, and each for receiving power from a different one of the two power sources. For use in data center environments with A-B power sources, it is desirable to deterministically manage the load on the A and B power sources. The automatic transfer switch may be operable to prefer and use the A power source (i.e., primary power source) when it is available and only use the B power source (i.e., secondary power source) when the A power source is unavailable. Conversely, the automatic transfer switch may be operable to prefer and use the B power source (i.e., primary power source) when it is available and only use the A power source (i.e., secondary power source) when the B power source is unavailable. For example, the source that has the desired voltage or any other power quality characteristic or combination of characteristics that is best suited for the EDP equipment load being fed may be preferred as the desired source. The automatic transfer switch can also make these determinations of power source preference based not only on availability, but also on the quality of the power. The ATS may be designed to allow the data center manager to choose which power input is the preferred input. This may be done by explicit interaction with the ATS unit (by a manual power input selector, graphical user interface object, or other user control for example), automatically (e.g., in response to a sensed electrical condition or environmental sensor input) or by remote control via remote EDP apparatus, for example the Zonit control module as is described below. This is desirable so that the data center manager can allocate power distribution system capacity with control and assurance of what source will normally feed those connected loads. The automatic transfer switch can also make these choices about what power source to prefer based not only the availability, but also on the quality of the input power. For example, the source that has the voltage or any other power quality characteristic or combination of characteristics that is best suited for the EDP equipment load being fed may be preferred as the desired source.

The automatic transfer switch also includes an output cord (or one or more output receptacles) attached to the switch module, for supplying power to the electrical load. Additionally, the automatic transfer switch can include one or more relays (e.g., mechanical relays, solid-state relays, or a combination of both) disposed within the switch module and coupled to the primary input cord. The relay is operable to sense suitable power delivery characteristics (i.e., quality) on the input cords and automatically couple the output cord to either the primary or secondary input cords in accordance with one or more values of the input power quality.

The automatic transfer switch also may have one or more communications mechanisms that allow it to be connected to remote EDP apparatus (such as the Zonit control module for example) enabling monitoring, control (including configuration) and reporting of the automatic transfer switch via remote and/or local electronic means. This can enable reporting of any power quality characteristic measured or observed at the ATS, the status of connected EDP equipment and any power quality characteristic that the EPD equipment load(s) affects. It can also include other variables such as the hardware and software health and internal environmental conditions of the ATS unit or a connected device with appropriate apparatus. Any other information that is desired about the ATS unit and its components for example cooling fan performance and status could be supplied. If desired the ATS unit can be equipped with connections for additional sensors such as environmental (temperature, humidity, moisture present, smoke detection), safety (door lock status, moisture present, smoke detection) or other sensor type as needed. The ATS unit can provide the information needed to do electrical usage measurement and billing functions if desired. The ATS unit can report any or all the information gathered to the remote EDP apparatus as needed and desired, where it can be processed, displayed and acted upon as desired. Alternatively the ATS unit can process the information and take actions, generate alerts or use other status information for display by the ATS unit as desired.

The ATS unit can incorporate the ability to sample the waveform of one or more power inputs and/or the power output of the ATS in high resolution, in one instantiation 1 5 kHz. An example circuit to do this which can be constructed in a small space, with a low power budget, for very low cost, (which makes it possible to incorporate in any of the inventions and their possible instantiations described herein) is described later. This sampling rate is sufficient to provide very detailed information on the power quality of the input source(s) and/or the connected output load or loads. This level of sampling is equivalent to high-quality dedicated power quality analysis instruments such as offered by Fluke, Tektronics and other manufacturers. Additionally, this same level of power quality measurement can be embedded as an optional capability into the power distribution devices described in the Zonit cases which are incorporated in full. Having this level of power quality measurement embedded into the power distribution system of a data center, factory, office or home allows a wide range of capability as described in the Zonit cases.

The automatic transfer switch may be implemented in a relatively small device that is suitable for deployment in less than a full 1U of rack mounting space or adjacent to rack mounted electrical devices or similarly to a PDU associated with those electrical devices. It may be used in any structure suitable for supporting electrical devices (e.g., 2 post equipment racks, 4 post equipment racks, various types of cabinets, or the like). It may be mounted in a partial 1U space that is already partially used by EDP equipment (thus not sacrificing any 1U rack spaces) or in parts of the rack that are not used when mounting. In some instantiations, the switch module may occupy less than 85 cubic inches, for single-phase configurations and 150 cubic inches for three-phase configurations. In this regard, the automatic transfer switch is likely to not require mounting space in an equipment rack, and this may reduce cooling problems that are associated with sizable components and longer power cords used in traditional designs. The switch may also consume relatively little power (less than 2 Watts in some instantiations) compared to other automatic transfer switches, due to the use of modern solid-state components and innovative design.

There are multiple instantiations of the automatic transfer switch that can be created, depending on the needs and requirements of the application. A variety of possible instantiations are shown in FIGS. 18-20. Some of the instantiations can be either single-phase or polyphase power ATS units. The instantiations have a variety of possible |form-factors|[bp31], some of which are capable of zero-U mounting, some of which are rack-mountable and some which are sufficiently small to be conveniently embedded in an industrial device, such as a control module enclosure or cabinet for that industrial device, as described in more detail in the Zonit cases. This small size factor is very important, rack-mounted ATS units can be difficult or impossible to integrate in many types of applications. Some of the instantiations may have features suitable for industrial device usage, such as DIN rail mounting compatibility, either by having the integral slots in the case accept a standard dimension DIN rail or by use of a DIN rail adapter, which can mount to the integral slots. Some instantiations of the ATS units may incorporate terminal blocks rather than input and/or output cords or receptacles, since this can make it more convenient to connect the ATS unit to the wiring harness of the industrial device or other application.

In accordance with another aspect of the present invention, an automatic transfer switch for automatically switching an electrical load between two power sources is provided. The automatic transfer switch includes a switch module that occupies less than 85 cubic inches of space. The automatic transfer switch also includes primary and secondary input cords, each attached to the switch module, and each for receiving power from a different one of the two power sources, and an output cord that is attached to the switch module for supplying power to the electrical load, or to a PDU capable of supplying power to a plurality of EDP equipment loads. Additionally, the automatic transfer switch includes one or more relays contained within the switch module and having a voltage sensitive input coupled to the primary input cord for coupling the output cord to the primary input cord when one or more power qualities of the primary input cord is acceptable, and for coupling the output cord to the secondary input cord when one or more power qualities on the primary input cord are not acceptable. Additionally, the primary source and the secondary source are selectable with regards to which is assigned to the physical "A" and "B" inputs of the automatic transfer switch.

In accordance with another aspect of the present invention, an automatic transfer switch, (the Zonit μATS-Industrial™ is one possible example) for automatically switching an electrical load between two power sources is provided. The automatic transfer switch includes a switch module that occupies less than 150 cubic inches of space. It can be provided in a range of amperage capacities as needed, but still be small enough to easily be mounted in an industrial control enclosure or cabinet. It can be DIN rail mounted, either directly or via an adapter. It can have a very high MTBF and a wide operational temperature range, suitable for industrial device environments. The automatic transfer switch also includes primary and secondary input cords, each attached to the switch module, and each for receiving power from a different one of the two power sources, and an output cord that is attached to the switch module for supplying power to the electrical load, or optionally a terminal block for the input and output power connections. Additionally, the automatic transfer switch includes one or more relays contained within the switch module and having a voltage sensitive input coupled to the primary input cord for coupling the output cord to the primary input cord when one or more power qualities of the primary input cord is acceptable, and for coupling the output cord to the secondary input cord when one or more power qualities on the primary input cord are not acceptable. The relays can be designed to be open when the control logic is not operational, which is the default for most ATS units. This insures that if there is a logic problem with the ATS unit it does not deliver power. Additionally, the primary source and the secondary source are both capable of powering the unit up if only one is energized. The unit can be equipped with either fuses and a Virtual Circuit Breaker w/reset button (as described in the Zonit cases incorporated by reference in full) or one or more small-form factor circuit breakers. In this way protection against overloads is provided. Each method has advantages. The automatic transfer switch can be provided with clearly visible status indicator lights that can be viewed regardless of the angle or orientation of the automatic transfer switch. This allows a wide variety of mechanical mounting configurations without interfering with visibility of said status indicators. The status indicator lights can be mirrored to or replicated by a remote display and/or to the remote management device(s) as desired, to be displayed as needed. The status indicator lights can indicate which power input source is currently being used. They can also display is the unused power source is present. This can be done by controlling the intensity, blink rate, pattern or other visible parameter of the indicator lights. The ATS unit can also incorporate Zonit ZCrush circuitry to prevent discharge of stored energy from the connected loads through the ATS unit when the ATS unit is performing a power source transfer. A number of examples of this phenomenon are discussed in U.S. patent application Ser. No. 16/817,504 entitled" Relay Conditioning and Power Surge Control," filed on Mar. 12, 2020, (the ZCrush case) which is incorporated herein by reference. A common practice in industrial control modules is to use a large filter capacitor across the AC main inputs (similar to what is done in AC/DC power supplies as discussed in the ZCrush case) and/or step down the AC voltage to 24 or 48 volts via a transformer that often can store a large amount of energy in its core which can be discharged through the ATS unit when a power transfer occurs. The ATS unit can also be auto-ranging, that is operate on a wide range of input voltages for example 24-277V, 48-277V, 80-277V or other desired voltage operating ranges. The unit can be designed to work with either DC or AC power.

In accordance with another aspect of the present invention, an automatic transfer switch, (the Zonit µATS-V2™ is one possible example) for automatically switching an electrical load between two power sources is provided. The automatic transfer switch includes a switch module that occupies less than 150 cubic inches of space. It can be provided in a range of amperage capacities as needed, but still be small enough to easily be mounted in an EDP equipment rack or cabinet. It can be DIN rail mounted, either directly or via an adapter in the cabinet. The automatic transfer switch also includes primary and secondary input cords, each attached to the switch module, and each for receiving power from a different one of the two power sources, and an output cord that is attached to the switch module for supplying power to the electrical load. Additionally, the automatic transfer switch includes one or more relays contained within the switch module and having a voltage sensitive input coupled to the primary input cord for coupling the output cord to the primary input cord when one or more power qualities of the primary input cord is acceptable, and for coupling the output cord to the secondary input cord when one or more power qualities on the primary input cord are not acceptable. The relays can be designed to be closed when the control logic is not operational, which is not the default for most ATS units. This insures that if there is a logic problem with the ATS unit it does continue to deliver power. Additionally, the primary source and the secondary source are both capable of powering the unit up if only one is energized. The unit can be equipped with both fuses and a Virtual Circuit Breaker w/reset button (as described in the Zonit cases which are incorporated by reference in full). This is compatible with failing closed if the ATS control logic fails, since in that case, the unit becomes a fused power cord on the side that is connected when the relays are not powered and closed. In this way protection against overloads is provided, regardless if the control logic is functional or not. The automatic transfer switch can be provided with clearly visible status indicator lights that can be viewed regardless of the angle or orientation of the automatic transfer switch. This allows a wide variety of mechanical mounting configurations without interfering with visibility of said status indicators. The status indicator lights can be mirrored to or replicated by a remote display and/or to the remote management device(s) as desired, to be displayed as needed. The status indicator lights can indicate which power input source is currently being used. They can also display is the unused power source is present. This can be done by controlling the intensity, blink rate, pattern or other visible parameter of the indicator lights. The indicator lights can also indicate if there is a power quality problem or the amperage being delivered exceeds a given percentage of the capacity of the ATS unit. This is useful in data center loads where EDP equipment is moved into and out of racks and the power delivered by the ATS unit can thereby vary. It helps data center staff not overload the ATS unit. The ATS unit can also incorporate Zonit ZCrush circuitry to prevent discharge of stored energy from the connected loads through the ATS unit when the ATS unit is performing a power source transfer. A number of examples of this phenomenon are discussed in the ZCrush case which is incorporated by reference. The ATS unit can also be auto-ranging, that is operate on a wide range of input voltages for example 24-277V, 48-277V, 80-277V or other desired voltage operating ranges.

According to a still further aspect of the present invention, a method for use in providing power to an electrical device is provided. The method includes providing an auto-switching device having a first interface for coupling to a first power source, a second interface for coupling to a second power source, and one or more third interfaces for coupling to the electrical device to be powered. The auto-switching device is operative to automatically switch between the first and second power sources in response to an interruption of the quality of the primary input power. The method also includes coupling the first interface to the first power source, coupling the second interface to the second power source, coupling the third interface(s) to the electrical device and selecting one of the first and second power sources as the primary source. Additionally, the automatic transfer switch, being connected via electronic means to remote management equipment, can also serve to turn off or on power to the equipment connected to the output of the automatic transfer switch in response to either manual operator desire, or automatically in the event of over-temperature, or fire/smoke detection, or any number of other conditions deemed necessary by the remote controlling equipment and any attached sensor devices monitorable by said remote controlling equipment.

Additionally, the automatic transfer switch has clearly visible status indicator lights that can be viewed regardless of the angle or orientation of the automatic transfer switch. This allows a wide variety of mechanical mounting configurations without interfering with visibility of status indicators.

Additionally, the automatic transfer switch module can incorporate unique mounting slots that ease the burden of physically and securely mounting the automatic transfer switch module to a secure mounting location. The unique slots allow use of a variety of standard off-the-shelf hardware combinations to attach to the automatic transfer switch module easily and without special adapters or tools.

According to a still further aspect of the present invention, a system for powering a rack mounted electrical device is provided. The system includes a rack or cabinet that has a plurality of power sources. Further, the system includes an auto-switching module including a first cord coupled to the first power source, a second cord coupled to the second power source, and one or more third cord(s) coupled to an electrical device supported on one of the shelves of or otherwise mounted to the rack or to a power distribution unit (such as a horizontal or vertically mounted plugstrip or powerstrip) capable of delivering power from the output of the automatic transfer switch to a plurality of equipment. The auto-switching module is operative to switch a supply of power to the electrical device(s) between the first and second power sources in response to an interruption on the current input source or other power quality characteristic of the input power. Additionally, the automatic transfer switch, via local or remote means (by connection to remote management devices), can also serve to turn off or on power to the equipment connected to the output of the automatic transfer switch in response to either an explicit operator request (e.g., entered by a user employing a physical selector, such as a button or switch, or employing an electronic sensor such as an object of a graphical user interface), or automatically in the event of over-temperature, or fire/ smoke detection, or any number of other conditions deemed necessary, either by the ATS unit or by the remote controlling equipment and the attached sensory devices of each. The ATS may also include a current limiting device for limiting the maximum current across the device to remain within a defined range.

The automatic transfer switch has clearly visible status indicator lights that can be viewed regardless of the angle or orientation of the automatic transfer switch. This allows a wide variety of mechanical mounting configurations without interfering with visibility of said status indicators. The status indicator lights can be mirrored to or replicated by a remote display and/or to the remote management device(s) as desired, to be displayed as needed. The housing may also include slots or other openings for dissipating heat generated by the ATS.

The automatic transfer switch module can be provided with unique mounting slots as part of its enclosure that ease the task of physically and securely mounting the automatic transfer switch module in a secure mounting location. The unique slots allow use of a variety of standard off-the-shelf hardware combinations to attach to the automatic transfer switch module easily and without special adapters or tools.

The solutions we have invented are innovative and provide considerable benefits. They include a number of electronic circuits that perform various functions. We describe below their usage in the context of an automatic transfer switch, but they may also be useful in other applications. The automatic transfer switch we are using as a descriptive example can incorporate the inventions described in PCT Application No. PCT/US2008/057140, U.S. Provisional Patent Application No. 60/897,842, and U.S. patent application Ser. No. 12/569,733, now U.S. Pat. No. 8,004,115, all of which are incorporated herein by reference.

The circuits are described below in relationship to an automatic transfer switch ("ATS") that is connected to two separate power sources, A & B. It should be noted that the example ATS is for single phase power, however polyphase ATS units can be constructed using the same circuits, which would essentially be multiple single phase ATS units acting in parallel. The only change needed is to synchronize certain of the control circuits so that they act together across the multiple ATS units to handle switching and return from the A polyphase source to the B polyphase source and back. The only change is to specify under what conditions to switch power sources. For example, given three phase power with X, Y & Z hot leads, a fault on any of three might be considered reason to switch to the B polyphase source. To return to the A polyphase source, all three polyphase leads may have to be present and of sufficient quality to enable the return to the A source.

In addition to the exemplary aspects and embodiments described above, further aspects and embodiments will become apparent by reference to the drawings and by study of the following description.

BRIEF DESCRIPTION OF FIGURES

For a more complete understanding of the present invention and further advantages thereof, reference is now made to the following detailed description taken in conjunction with the drawings in which:

FIG. 2-A is a schematic of one side of the Input Disconnect Switch and Sync Detector in accordance with the present invention;

FIG. 3-A is a schematic of the Input Selection and Power Switching Section (Gate Keeper) in accordance with the present invention;

DETAILED DESCRIPTION

Figure 1:
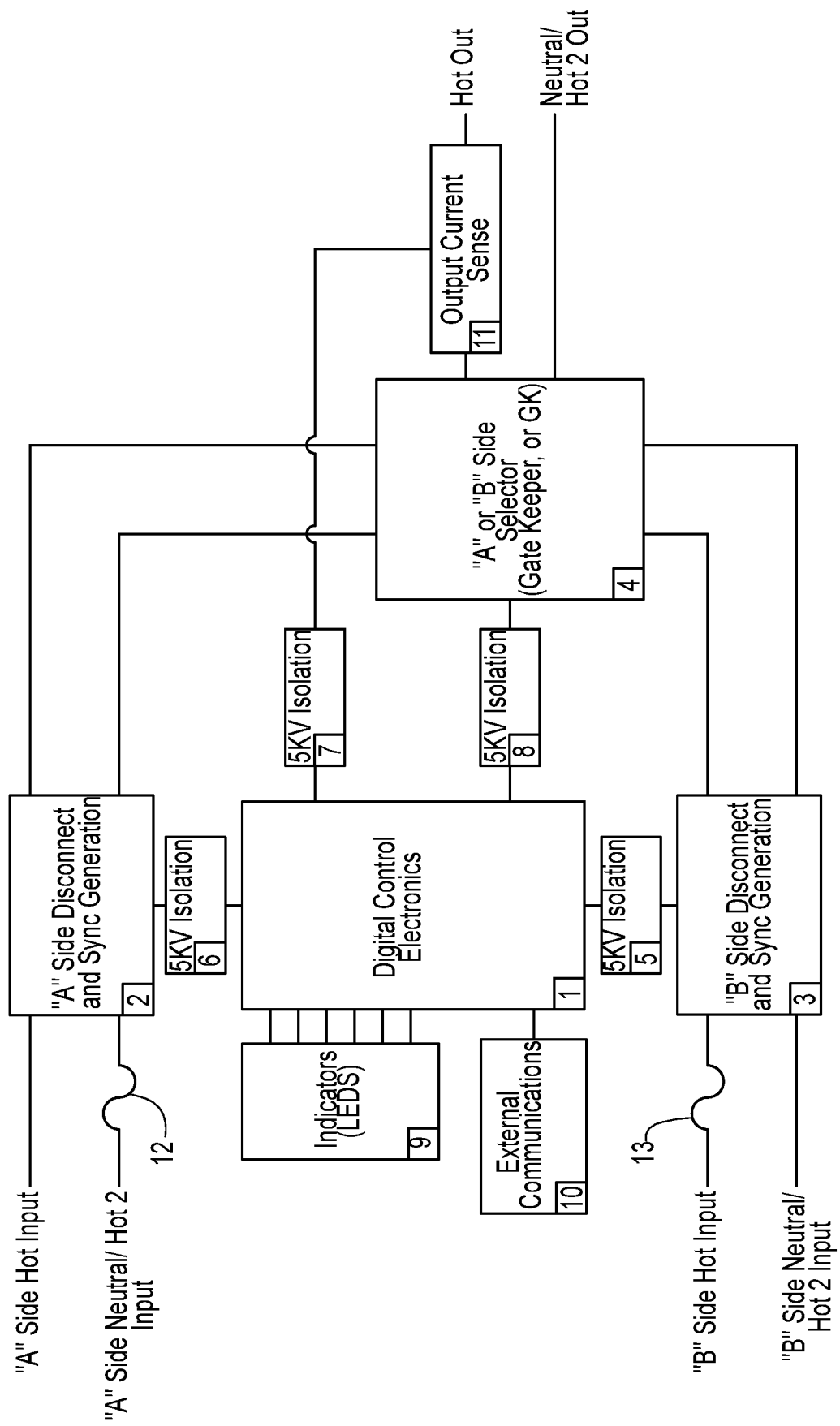
FIG. 1 is a basic block diagram showing an overview of the Electrical and Electronic Subsections in accordance with the present invention.

An automatic transfer switch system is described below that has a number of advantageous characteristics relating to data conductivity, compact size, avoiding use of valuable rack space, primary power source selection, remote monitoring and reporting, maximum current control and the like. Specific examples embodying these advantageous characteristics are described below. However, it should be understood that alternative implementations are possible in accordance with the claimed invention. Accordingly, the following description should be understood as exemplary and not by way of limitation.

The primary function of the ATS is accomplished by transferring electrical power from one source to the other via a set of mechanical relays. In addition, the closure of these mechanical relays is augmented by the use of modem semiconductor switches, e.g., Insulated Gate Bipolar Transistors, (herein after referred to as IGBT) but these devices could be other semiconducting switches of sufficient Voltage and Current handling capabilities in the categories of TRIACS, SCRs, Bipolar Transistors, Field Effect Transistors, or combinations of each. These can be configured in a variety of ways, each with advantages and disadvantages. A preferred instantiation as applied to this ATS is utilizing the IGBT. They are selected due to ease of turning them on and off, robust construction, and resistance to false conduction.

The timing and execution of desired functions is accomplished utilizing a digital control circuit comprised of a peripheral interface controller, or PIC. This device is a member of the "programmable function" devices and allows for a set of code to be recorded in the device that directs the actions of the overall digital control system. The PIC has sufficient computational capacity to perform certain mathematical computations to allow for precision calculation of voltages, current, time and other precision parameters necessary for very precise control of the timing of the relays and solid state switches.

The ATS also includes advanced communication capabilities via a connection to remote EDP equipment for the purpose of reporting status, electrical characteristics of the attached electrical "mains," and a variety of other information contents that could be useful in the maintenance of power systems attached to the ATS, either as source power or as attached equipment (herein after referred to as the "load"). This communication portal on the ATS utilizes as a primary means of communicating, the internationally accepted schema called Universal Serial Bus (USB), and as a secondary communication protocol of PICKIT programming transport. This secondary communication is included to allow field upgrades to be made without requiring the ATS device to be opened up for access to traditional programming ports. A third communications means is also provided that allows simple Digital Serial Data to be transmitted and received by the ATS via un-encoded 5 Volt logic levels. This third communications means is provided to allow interfacing with long-line communications means. The USB transport and protocols are not especially well suited to transmitting and receiving data over distances greater than 10 to 30 meters. For applications requiring communication in harsh environments over long distances, an interface is necessary to convert the signals to various other standards. The availability of the raw "serial data" through the communication port enables the direct attachment of alternate transport standards interfaces simply and economically.

Description of Circuit Operation.

Figure 8:
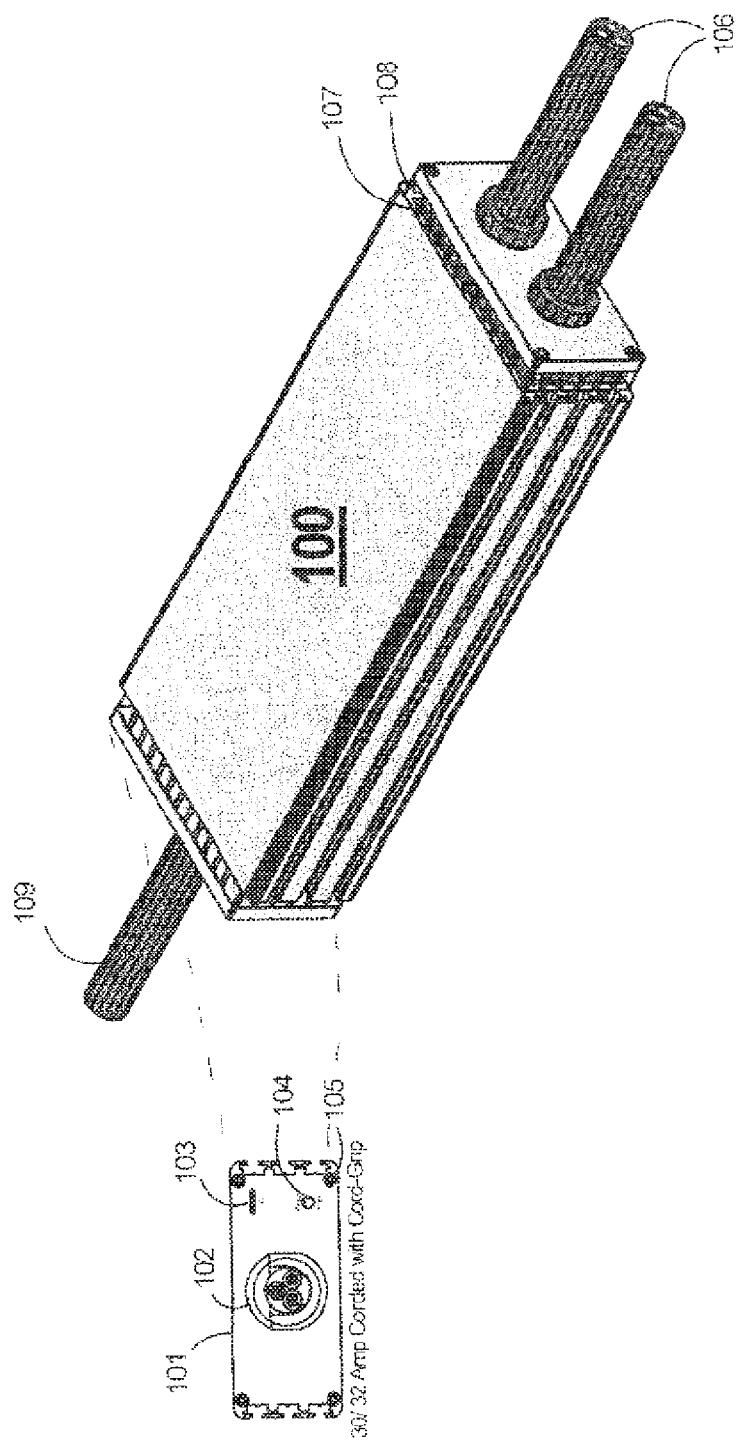
FIG. 8 shows a 30 amp corded Automatic Transfer Switch in accordance with the present invention, shown in perspective and left end views.

FIG. 8 shows perspective and rear views of one instantiation of the ATS 100. As shown, two power cords 106 enter the ATS (A power and B power inputs) and one cord 109 exits the ATS (power out to the load). It also shows that the ATS has indicators 107 located beneath a clear crenelated plastic lens 108 that also acts as the air inlets. Shown also is the aforementioned communication portal 103 and a small push-button 104 used for inputting some local control commands directly to the ATS.

The ATS 100 has a pair of small fans internal to the assembly that provide cooling to the various components inside as necessary. These fans are operated only as needed and only at what speed is necessary to maintain acceptable operating temperatures. Two fans are included for redundancy, and the controller inside the ATS 100 can report via the communications port to remote monitoring equipment any detected faults, including the performance characteristics of either of the fans. Temperature at the air inlet of the unit as well as the air outlet is also reported to the remote monitoring equipment.

Referring to FIG. 7, The Overview of Basic Switching Concepts, a basic understanding of the operation of the ATS can be gained.

Figure 7B:
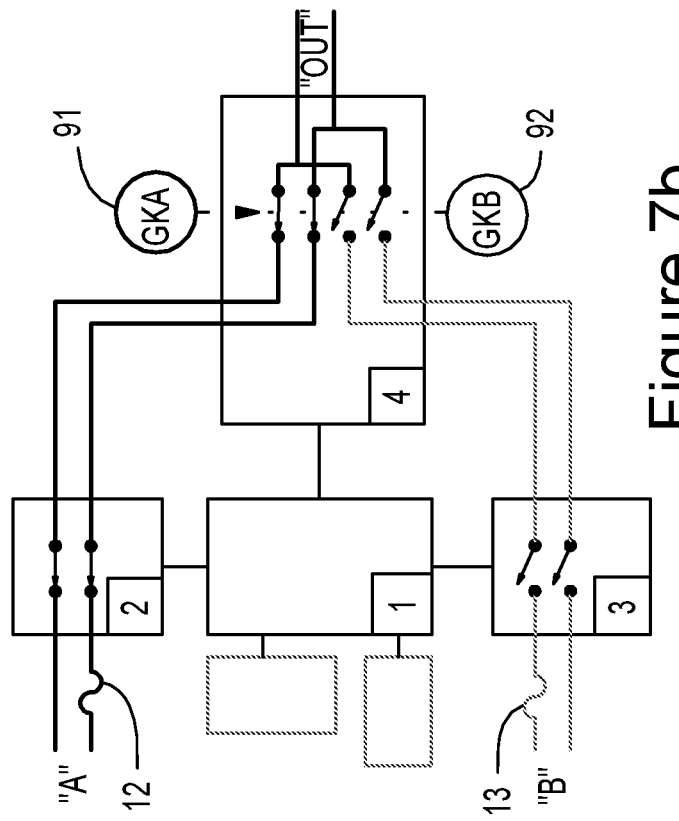
FIG. 7 shows timing diagrams providing an overview of the generic timing and sequencing of events in accordance with the present invention.
Figure 7A:
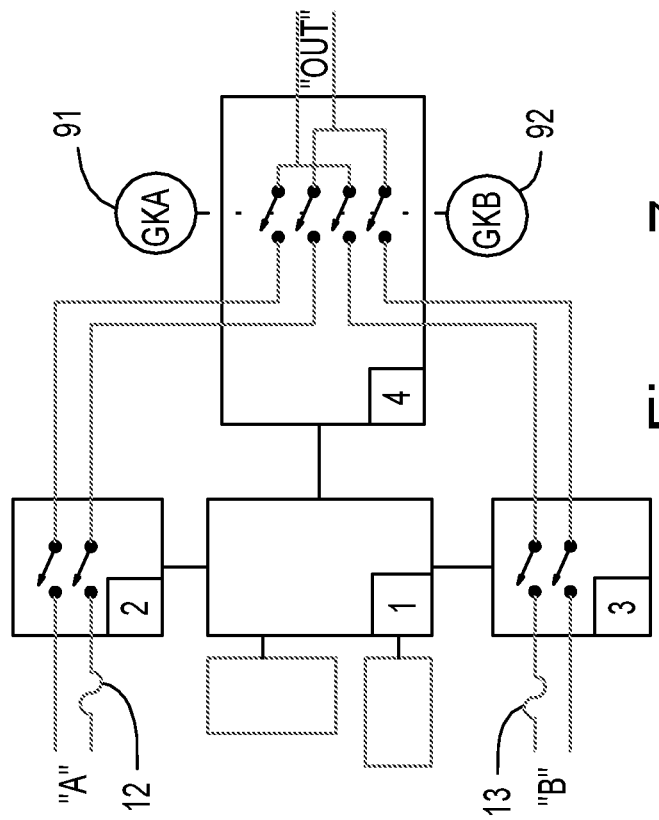

FIG. 7a shows the off state of the ATS when no power is applied. Switches 2, 3, 91 and 92 are all open.

FIG. 7b shows the state when power is applied to the A input. The unit powers up and the controller turns on the A input switch 2 and it also closes the Input Selection Switch 4 (herein after referred to as the GK, short for Gate Keeper) and is allowed to pass to the output through the GKA switch 91. Power can now flow from the A input to the output.

FIG. 7c shows the state when power is applied to the B input. The unit powers up and the controller turns on the B input switch 3 and it also closes the Input Selection Switch 4 and is allowed to pass to the output through the GKB switch 92. Power can now flow from the A input to the output. When power is applied to both inputs, as will be the normal condition, then both of the Input Selection Switches will close and deliver power to the GK 4 where the controller will direct either the GKA switch 91 or the GKB switch 92 to gate power to the output. Never should both GKA 91 and GKB 92 ever be closed at the same time. This will result in shorting the two inputs together.

FIG. 7d shows the condition of having both GKA 91 and GKB 92 on at the same time. A fuse located on one side of the A input 12 is shown "blown" or open, in this case. Since the GK has shorted both leads of A input to B input, then the opposing side must also be protected. The B input also has a fuse 13 on one of its inputs, but it is in the opposite lead path. It is also shown "blown," or open. These two fuses 12, 13 not only protect the load from exposing the circuit to a dangerous condition, but they also prevent a serious overload of the input power sources in the unlikely event of a catastrophic internal failure of the ATS. Using this technique, two fuses can protect all 6 leads, two on the A input, two on the B input and two on the Output, with any overload condition in any combination.

Figure 7F:
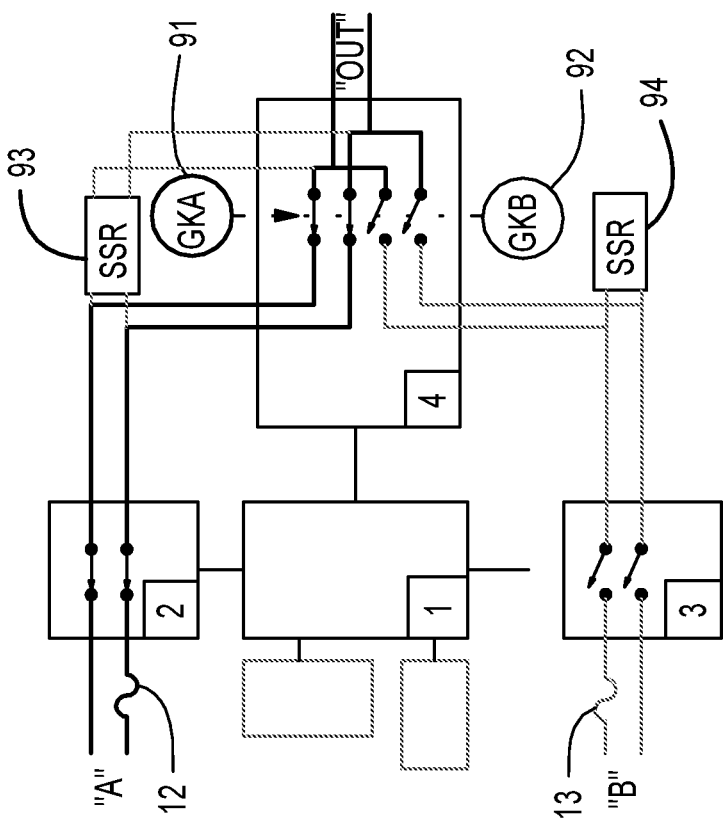
Figure 7E:
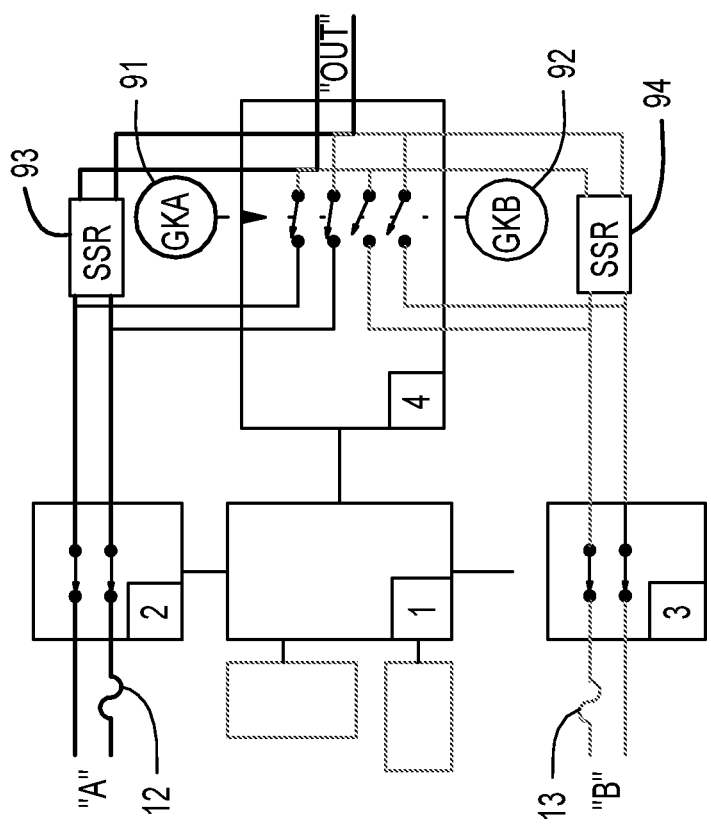

FIG. 7e shows the introduction of the Solid State Switching elements 93, 94. Mechanical relays all require some finite amount of time to operate after the signal is applied to the coil, either to close or to open the contacts. Solid State Switching devices generally have a very short time to operate, on the order of microseconds. However, they do exhibit a voltage drop across the junction when conducting (closed) and this voltage drop represents loss of power in the circuit. For example, an IGBT based semiconductor AC switch (such as applied in this instantiation) exhibits a voltage drop of about 3 volts at 30 Amps of conducted power. That relates to 90 Watts of loss. The equivalent mechanical relay will exhibit a loss of about 1 Watt at the same applied current. Thus, a mechanical relay augmented with a solid state relay is an ideal combination for maximizing efficiency as well as operation speed. When desired to conduct, an augmented relay configuration as shown in FIG. 7e, the conduction of electrical current will commence within about 10 microseconds of the command to conduct. This allows precise timing of the connection to the power source. However, the disconnect time is still subject to the response time of the mechanical relay since the contacts of the mechanical relay are in parallel connection to the SSR element. Even though the SSR element may disconnect, the mechanical contacts will remain closed for a short time prior to releasing. This delay is of little consequence when switching from one power source to the other when power is available on both, such as is the case when the ATS is returning to the preferred side after the power has been restored on that preferred side. Precise timing of the disconnect can be accomplished in this case because the mechanical relay can be commanded to release prior to the desired time of the actual disconnection, while the SSR is still conducting. Then, at the desired time of disconnection, the SSR can be commanded to release. Thus, for most conditions, precise timing can be achieved, with little power loss in this configuration. The use of the IGBT and bridge AC switch has the advantage of being able to turn on and off in very short time periods. It is difficult to turn off a Triac, or an SCR based switch, as those devices want to stay on until current stops conducting, thus they stay on until the AC current passes through the zero crossing as the sine wave changes polarity. In the example shown in FIG. 7e, The SSR on side A 93 is shown in the on condition, and conducting power to the Output while the mechanical relay contacts of GKA 91 are moving to try to close. Any variation in timing that might be imposed by the mechanical effects of the motion of the relay contacts are masked by the SSR conducting. Albeit the associated power loss intrinsic to the SSR delivering the current is present during this time, it is of only a very short duration, about 10 milliseconds, before the mechanical relay contacts close, thus reducing the power loss to a minimum. The SSR can remain on but it will have no effect.

FIG. 7f shows the final configuration with power being conducted through the GKA relay 91 to the output, and bypassing the SSR 93.

Sub-Circuit Detailed Descriptions

FIG. 1 shows the general configuration of all of the sub-circuits and helps identify their function in the overall operation of the ATS. Note that both the A side AC power connection and the B side AC power connections pass through a "N" Side Disconnect and Sync Generation sub-circuits 2,3. When AC voltage is not present on the input to one or both of these circuits 2,3 the internal mechanical relay inside of this circuit remains in the "open" state, thus no power is passed through to the Gate Keeper 4. These "N" Side Disconnect and Sync Generation sub-circuits 2, 3 provide several functions to the operation of the ATS. Disconnection from the GK 4 when power is not present on the input provides safety disconnection from the source and provides required disconnection isolation voltage capacity required by various safety agencies such as Underwriters Laboratory (UL). The mechanical gap on the relay contacts prevent voltages as high as 3000 Volts from passing through. Commands from the Digital Control Electronics 1 can command the "N" Side Disconnect and Sync Generation sub-circuits 2, 3 to engage or dis-engage, as timing needs are satisfied.

The "N" Side Disconnect and Sync Generation sub-circuits 2, 3 also have a circuit in them that detects the AC voltage near the point where it crosses zero when changing from one polarity to the other. This signal generation allows a pulse to be generated that is symmetrical about the zero crossing to be formed and sent to the Digital Control Electronics 4 for use in providing information needed to electronically synchronize and control the various actions of the ATS.

Figure 11:
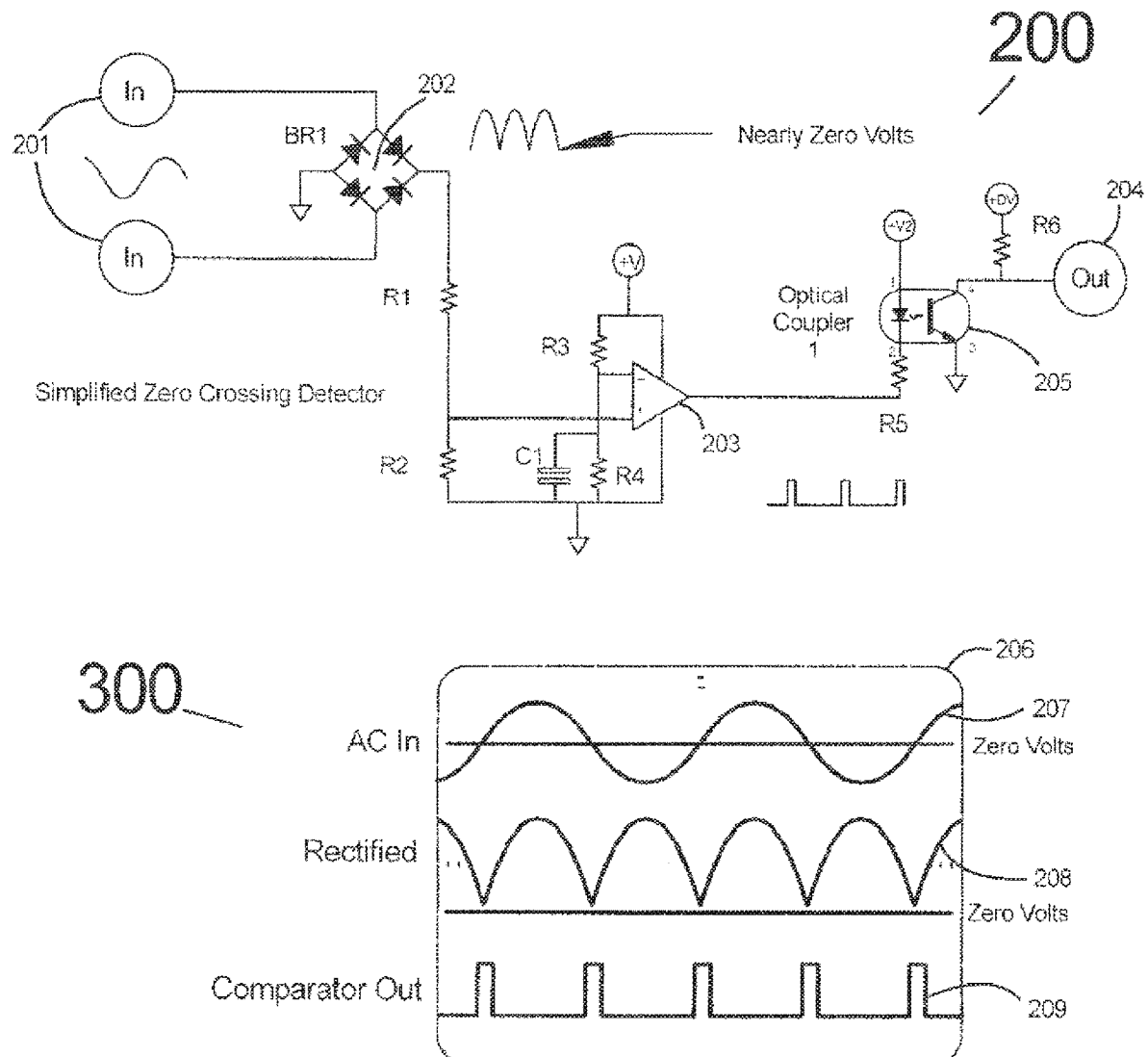
FIG. 11 shows a circuit and method for detecting zero crossings in accordance with the present invention.

FIG. 11 shows the simplified means that this is accomplished in the "N" Side Disconnect and Sync Generation sub-circuit. The circuit 200 is comprised of three main elements, the input bridge 202, comparator 203 and isolation optical coupler 205. As AC voltage is applied to the input 201 it becomes rectified in the bridge 202. The rectified voltage is scaled down to a useable voltage by resistor divider R1 and R2 and that voltage is applied to the input of the comparator 203. The other input of the comparator 203 has a reference voltage applied to it formed by the resistor divider R3 and R4 and is filtered by the capacitor C1. When the applied rectified voltage from the AC bridge becomes greater that the reference voltage, the output of the comparator 203 switches "On," in this case the output goes to 5 volts, or High. When the applied rectified voltage from the AC bridge becomes less that the reference voltage, the output of the comparator 203 switches "Off", in this case the output goes to O volts, or Low.

The synchograms 300 show the voltage—time waveforms typical of this circuit 200. The AC In 207 is rectified 208, and when the thresholds are crossed, the output of the comparator produce pulses 209 at the point where the original AC in 207 crosses at the zero crossing plus the threshold of the comparator. These pulses are nearly symmetrical about the actual zero crossing of the original AC In voltage.

The Sync pulse formed in "N" Side Disconnect and Sync Generation sub-circuits 2, 3 also carries information about the applied voltage to that circuit in the form of the pulse width. As the voltage increases the pulse width becomes narrower and narrower. This allows detection of the applied voltage by the Digital Control Electronics on the same signal path as the synchronization pulse.

Figure 12:
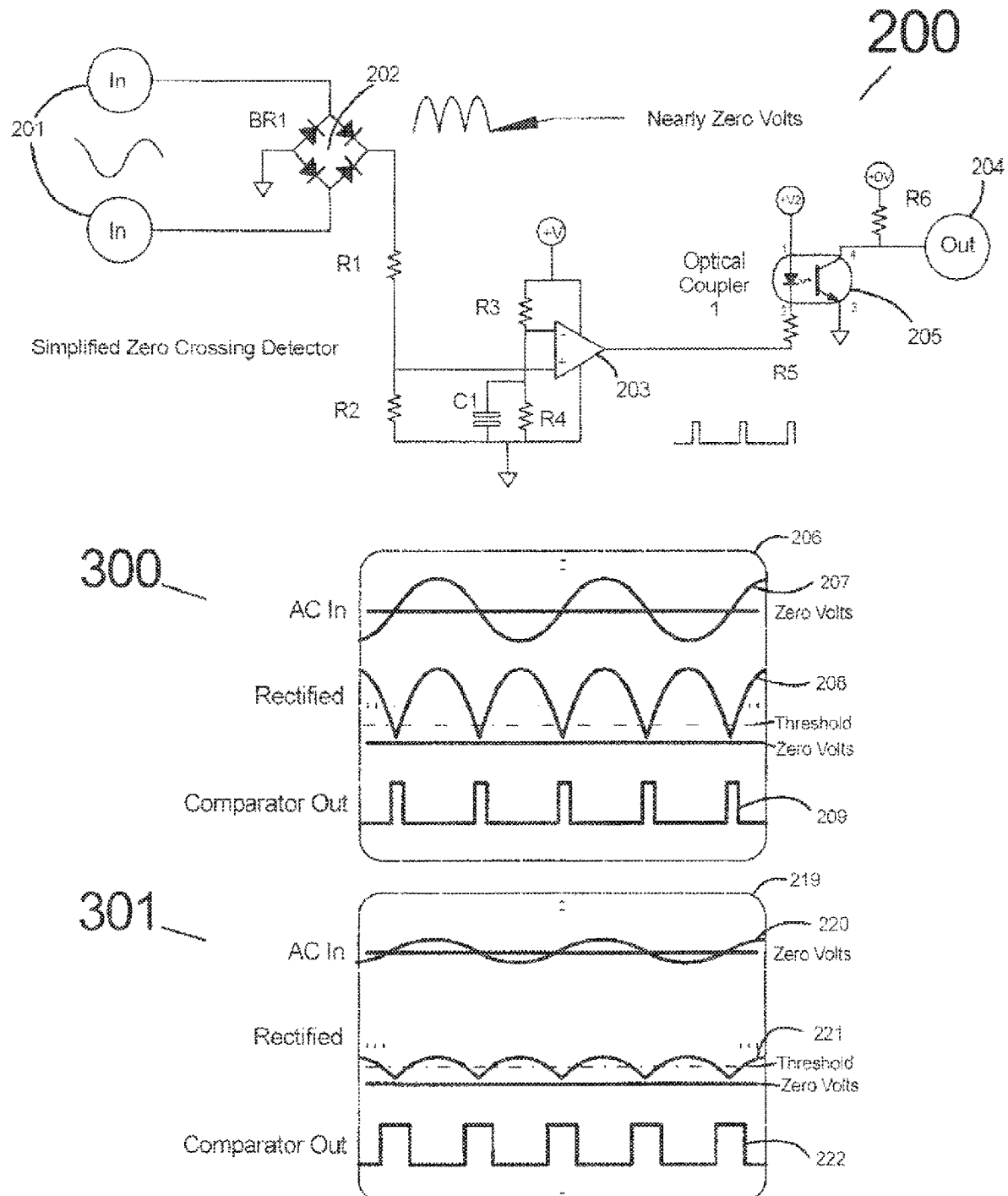
FIG. 12 shows how the synch detector circuit extracts the AC input voltage valve in accordance with the present invention.

FIG. 12 shows how the sync detector circuit also functions for extracting the AC Input Voltage value in the Digital Control Electronics Section. Assuming a high voltage of, for example, 240 VAC, is represented by the synchogram 300 at the AC In 207. The rectified Voltage 208 is then crossing the threshold and results in pulses 209 formed that are narrow. But, if a lower voltage, say 120 VAC is applied as shown in the second synchogram 301 the voltage threshold of the rectified AC voltage 221 is crossed sooner and as a result the Comparator Out 222 pulses become wider. The Digital Control Electronics can compare the time of the rising edge to the falling edge of these pulses and apply mathematical formulae to retrieve the exact voltage that is represented by those pulse widths. Alternatively, the Digital Control Electronics can hold a table of representative values that, when compared to the detected pulse width times, can also result in very accurate representations of the applied voltages.

The output of the comparator circuit in the "N" Side Disconnect and Sync Generation sub-circuits is passed through an optical isolation circuit to make sure that the Digital Control Electronics is electrically isolated from any AC or DC Voltage applied to the inputs. This is a safety requirement and is enforced by various regulatory agencies such as Underwriters Laboratory (UL).

Figure 2:
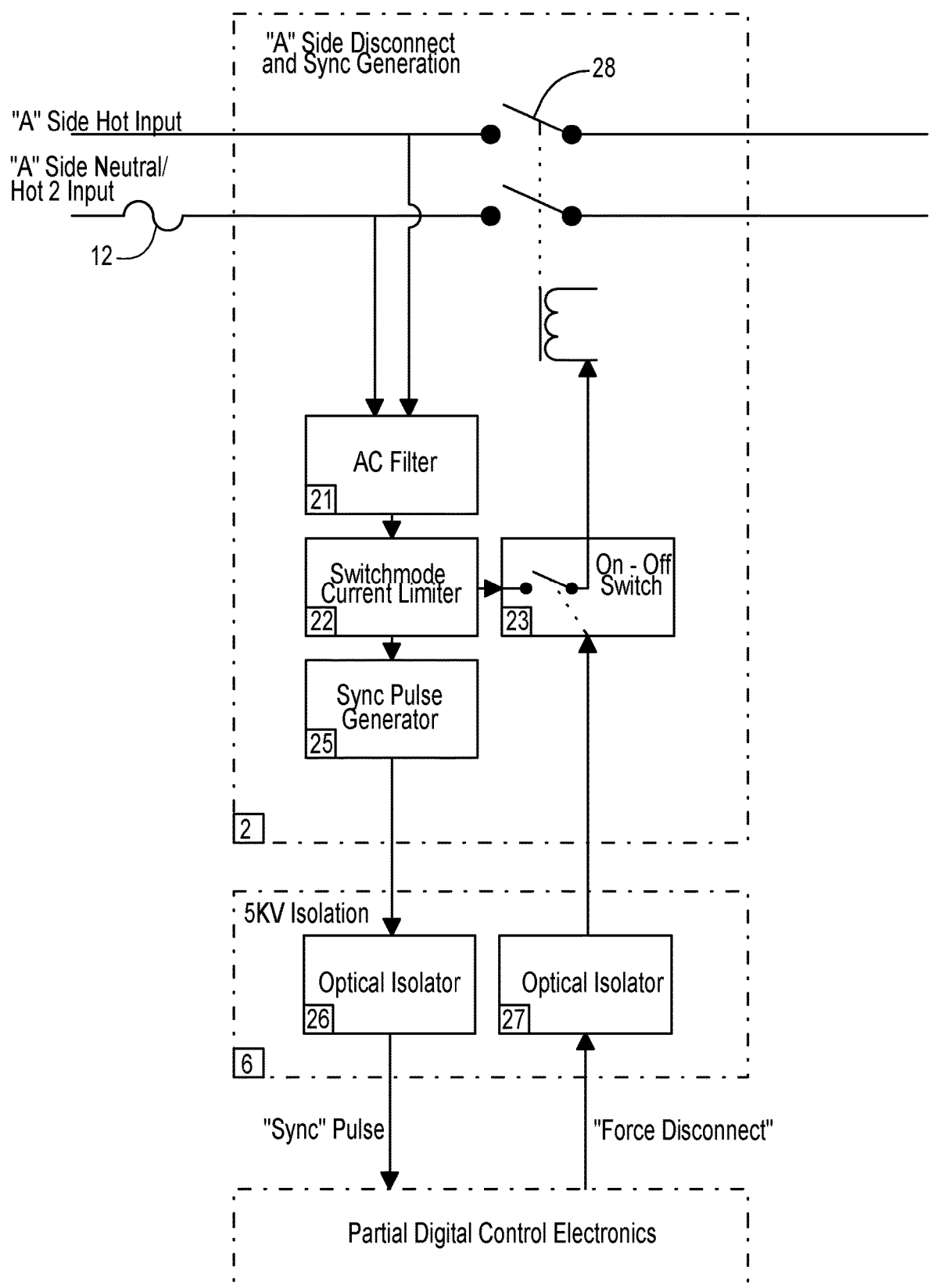
FIG. 2 is a detailed block diagram of the Input Disconnect Switch and Sync detector in accordance with the present invention.

FIG. 2-A shows the schematic of the "N' Side Disconnect and Sync Generation sub-circuits. The AC filter section 21 shows a simple Pi filter attaching the AC mains to the electronics of the "N' Side Disconnect and Sync Generation sub-circuit via a fuse F5 of 250 ma. A pair of inductor and a capacitor are used to prevent any high frequency noise generated in the attached circuits 22 from entering the AC mains lines. This is done to prevent interference with other external electric and electronic devices. This is also necessary for various compliance agencies such as Federal Communication Commission, of FCC, as well as others. After power is filtered, it is delivered to the Switchmode Current Limiter 22 where the AC high voltage is rectified in D2, D3 D8 and D9 and delivered to the filter capacitor C2 via D4. D4 isolates the rectified DC from the bridge from the filtered DC of C2. The un-filtered rectified DC is delivered to the comparator through the resistive divider R6 and RS for developing sync and voltage data as previously described. Rectified and filtered DC voltage at C2 is delivered to the Switching chip Q9 via a filter inductor pair of L1 0, a ferrite bead for very high frequencies, and L12, for medium frequency limiting. The switching chip Q9 turns on and off at about 80 Khz, and the duty cycle determines how much current is present in L1. Since this is switching into L1 from a monopolar source, the flyback energy in L1 is contained by D10. The Switching chip chip Q9 is pre-programmed to adjust the duty cycle to maintain a constant current of 20 ma. This chip is originally designed for use in modem LED lighting, but is r purposed to simplify the power supply design of this invention. The varying pulses in L1 are translated to a fairly constant current of 20 ma and then is allowed to pass through the coils of the two relays 21 that switch on the main AC power. The other side of the two relay coils 21 enter the On-Off Switch 23 at the Drain of Q5. If Q5 is "On," the current then passes to the secondary filter capacitor C7 In the Sync Pulse Generator section 25. 20 ma ov current is presented to the Cathode of ZD3, and when the voltage reaches 8.2 Volts, the Zener conducts to maintain about 8.2 Volts. This voltage is presented to the input of the 5 volt regulator Q7. This is a precision 5 volt linear regulator. As long as the total power requirements of the output of the regulator, and the attached circuits does not exceed 20 mA, then ample overhead voltage will be present to maintain precision 5 volt regulation. The design of the Sync Pulse Generator 25 Comparator circuit is such that there is very little current necessary to accomplish the detection function. Only about 2 mA is actually used in this part of the circuit. This leaves 18 ma available. Some of the 18 mA available at the input to the 5 volt regulator Q7, is diverted to the opto-coupler U4 26 and through the 1K resistor connected to the output of the comparator U7. If the U-7 is in worst case voltage detection mode, where the output is "on" (or low) all of the time, then all 8.2 Volts is dropping through the 1 K resistor, minus the 2 volt drop of the LED in the opto coupler U4. The resultant maximum current is 6.2 mA. Thus, for all cases, the series switch mode regulation of a total of 20 mA, is adequate to drive all possible combination of circuit requirements.

This method was chosen to optimize the efficiency of operation of the circuits. Very little power is wasted, and the total circuit power efficiency is about 84%. The total quiescent power used to operate the "N' Side Disconnect and Sync Generation sub-circuit is about 0.65 Watt. Both the A and B sides add up to around 1.3 Watts. This is a very high efficiency for all of the functions achieved.

This scheme also makes the operation of these circuits functional from about 30 Volts of AC applied to the mains inputs all the way up to 300 Volts. These circuits must function across the maximum range of AC input voltages to allow monitoring and functionality of the ATS regardless of the voltage applied.

A signal that comes from the Digital Control Electronics, "Force Disconnect" 27 is presented in cases where the Controller wishes to shut off an input. This is done during every transfer cycle to prevent any possibility of carrying an arc between the contacts of the Gate Keeper (FIGS. 3, 39 and 40) that would cause a short between the A side and the B side Power Inputs.

The "Force Disconnect" 27 signal causes the LED in the opto-coupler U1 to turn on the phototransistor in U1, which in turn shorts the Gate of Q5 to the Source of Q5. This turns the Q5 Drain off and shuts off the current path to the relays. About 2 ms. Later the relay contacts open and power is disconnected between the input and the output of the Disconnect relays 21.

When the "Force Disconnect" is removed from the opto coupler Ul, and the phototransistor turns off, then current from R1, 3.9 Meg ohm resistor is applied to the gate of Q5, the voltage rises to about 10 volts very quickly and the Drain of Q5 is connected to the Source and Q5 is turned on. Current can now pass through the coils of the switching relays, sourced by the switch mode chip Q9, as described earlier. The relays 21 are now energized and the contacts are closed about 7 to 10 ms later.

Figure 3:
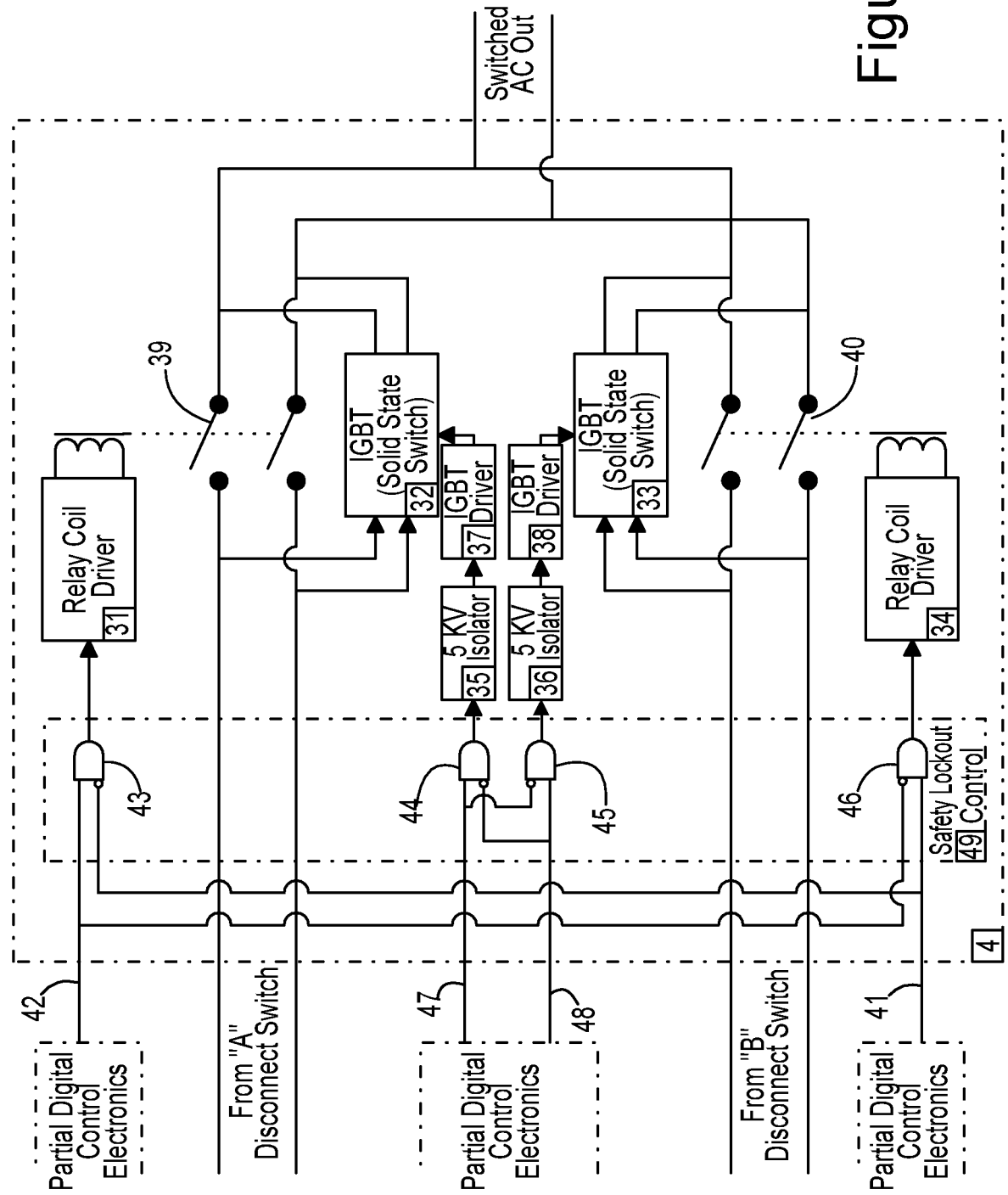
FIG. 3 is a detailed block diagram describing the various functions of the components of the Input Selector (Gate Keeper) sub section in accordance with the present invention.

During the time that a "Force Disconnect" is present, there is no need for sync pulses during the transfer process. Voltage and timing have already been determined by the Digital Control Electronics. But a "Force Disconnect" usually only lasts for 20 ms or so, just long enough to complete a transfer. During that 20 ms, power stored in C15 keeps the comparator operational, and pulses can continue to be detected if there ever became a need to utilize the information. FIG. 3 shows the detailed block diagram of the Input Selector, or Gate Keeper (GK). This is the core of the ATS. This is where power from either the A side Disconnect Switch, of the B side Disconnect Switch is directed to the Output and eventually to the "load". Its operation is directed entirely by the commands from the Digital Control Electronics. When no signals are present from the Digital Control Electronics all of the relays in the GK, and the Solid State Relays (SSRs) are in the open, non-conducting state. This presents a "Fail Safe" condition.

In order for the Digital Control Electronics to direct power from the A Side Disconnect Switch output, it must first make sure that no control signal is being sent to the B side steering circuits. A special piece of code in the Digital Control Electronics makes this check every time a attempt to change the state of either input is made. It is critical that the A side and the B side are never connected to the output at the same time, as this would result in a short circuit between the A side and the B side inputs and would cause a fuse to blow, and perhaps more damage. A second layer of protection is included with the implementation of hardware interlock 49 that prevents two commands from conflicting. For example, if the Digital Control Electronics requests that the A relay coil driver turns on by asserting the control line 42, that signal will also be present at the input of the logic gate 46. Since the true state of the A side request is inverted at the input to the logic gate 46, any signals present at 41, the control line that would drive the B side, is blocked by the gate 46. Conversely, a signal from the Digital Control Electronics requesting to turn on the B side Relay Coil Driver 41 that is asserted will be present at the inverting input to the logic gate 43 and in turn mask any signals coming from the A side Digital Control Electronics command 42 to turn on the A side Relay Coil Driver. The same concepts apply to the IGBT drivers. These function similarly to the Relays, but with nearly instantaneous response times. The commands to turn on one side or the other will result in a masking signal sent to the opposite side and prevent a dual turn on condition to exist. A "high" in the IGBT drive A side control input 47 will be presented as a low to the gate on the b side 45 and inhibit any signaling from the Digital Control Electronics from passing through the gate 45. Conversely, A "high" in the IGBT drive B side control input 48 will be presented as a low to the gate on the b side 44 and inhibit any signaling from the Digital Control Electronics from passing through the gate 44. 5 KV Optical Isolators are included between the Digital Control Electronics and the IGBT Drivers. This is necessary since the IGBT drivers operate at the AC Line voltage potential of their respective AC sources. The Relay Coil Drivers do not require isolation, the Coils of the relays 39, 40 are isolated from the AC Line voltage mechanically.

FIG. 3-A shows the detailed Electronic Schematic of the Input Selector, or Gate Keeper (GK).

When the Digital Control Electronics determines that the A side AC power should be connected to the Output, it simply asserts both the Gate Keeper o A (GK to A) signal and IGBT Drive A The 5 volts logic control signal presented at GK to A will turn on the FET Q1 1. It's Source is connected to ground, so the Drain goes to ground, thus supplying current to the coils of the A side Gate Keeper relays, RY 3 and RY 7 These relays acquire coil current from the +12 Volt power supply. Magnetic field current starts to build in the coils and the relay is starts to energize. Generally speaking these relays require 7 to 10 ms to operate. The bigger the relay, the slower the operation, generally. During this time the second half of the operation has begun. The Digital Control Electronics has also issued a assert command to the IGBT Drive A input. This High level (5 Volts) signal sends current to the LEDs of U 13 and U 15, 5 KV Isolation opto-couplers, via resistors 27 and 28. This current is dependent on Q14 a PNP bipolar transistor being turned on also. The turn on of Q4 is generally present due to the base pull down resistor R31. If, for some reason, the IGBT Drive B was high (asserted for some reason), the base of Q 14 would also be high, and no current would be able to go through the collector of Q14, thus disabling the IGBT Drive A command. The transistor Q14 is essentially the logic gate discussed prior with FIG. 3, Logic Gate 44. This is the second layer fail-safe discussed earlier. However, assuming that the IGBT Drive Bis not asserted, and that the IGBT Drive A is asserted, and that current is now flowing in U 15 and U 13, the other side of those opto-couplers will now be also conducting.

To understand how the IGBT drivers turn on the IGBT, it must be assumed that AC power has been present coming from the A Side Disconnect Switch for at least a little while. That AC Voltage that has been present has been conducting through Diodes 13 and 32, and R 41 and R3, charging Capacitors 26 and 32, each to 20 Volts. When these capacitors reach 20 Volts, the current is diverted through Zener Diodes ZD 5 and ZD 1, and the voltage remains at 20 Volts. The capacitors are 4.7 micro-Farads each. The amount of charge they hold is important later on in the discussion.

When the optical coupler photo transistor in U13 turns on, 20 volts from C26 will be conducted through R9 and on to the base of Q13 and resistor 2. Capacitor 33 presents a very short impedance to this turn on and filter out transient noise. Otherwise, Capacitor 33 has no effect. When the voltage is applied to the base of Q13, the voltage rises very fast, limited essentially by the charge rate of C33. As the Base of Q 13 rises, the transistor releases its current path from the Emitter to the Collector, essentially shutting off this transistor. The rising voltage at the base of Q 13 now is passed to the base of the IGBT Q2 via the diode 21. These rising voltages are now limited by the base capacitance of the IGBT Q2 and the current limiting of the Opto coupler and R33. Since the opto coupler is around 200 ohms at this time, the rise time is relatively fast, on the order of 150 micro seconds. The IGBT Q2 is now conducting. Any AC Voltage that appears across the contacts of the RY7 at this time is shunted through the Diode Bridge BR2 and through the IGBT Q2 Collector-Emitter. Effectively, the AC inputs to the bridge BR3 are shorted. This whole process has taken about 200 micro-seconds. Meanwhile, the Relay 7 is just starting to energize. It will be another 7 to 10 ms before it actually has the contacts meet one another. The AC input to this side of the Load is now connected.

The same process is occurring on the other half of the A side IGBT drive, the side driven by U15. Ultimately, IGBT Q3 will be turned on, shunting Bridge 3 and delivering AC power to the other side of the A side path between the A side Disconnect Switch to the Output and to the load.

After a period of around 100 ms., it is assumed that the relays have closed and that all of the current is bypassing the IGBTs. The Digital Control Electronics will de-assert the IGBT Drive A and the IGBT Drive B control signals. If, for some reason the Digital Control Electronics did not release the drive signals, a designed in feature of the IGBT Drivers themselves will release the drive signal from the IGBT gates and disconnect the devices. This is accomplished by the decay of the stored charge in the aforementioned C26 and C32. The current path from the C26 and C32, through the opto couplers and through the 68 K base resistors for Q 13 and Q 2 twill eventually discharge the C26 and C32 to the point where the IGBTs do not have sufficient voltage on the Gates of these devices to sustain current flow in the Collector to Emitters of Q 2 and Q3. Even though some current is being supplied to the C 26 and C32 from the D13 and D32, the resistive divider of 560K and 68 K, through a half wave rectifier, will not provide sufficient voltage at the base of the IGBTs to sustain current. At maximum input voltage to the ATS of 277 volts AC, only about 6 volts will be present at the gate of the IGBT and the device will turn off Careful selection of components has enabled this feature without the addition of any additional circuitry.

When the Digital Control Electronics determines it is time to shut off a particular side of the GK, there are two possibilities. One is for an immediate shut off, implying it is being turned off as fast as possible due to a loss of voltage on this path. This would be the case when, for example, this is the A side, the A side is the preferred, and the load has been connected to the A side for some time. This is a normal state.

When the A input AC voltage fails below an acceptable level, the control logic can determine that the A input power is failing and an outage (vs. a power quality disturbance for example) is in progress. It is now necessary to transfer to the alternate power source (the B side in this example) as fast as possible. The first action to consider after the Digital Control Electronics has determined that the failure is valid by observing the a Sync pulse occurred at a time it shouldn't have, or the sync pulse was longer than it should be, the Digital Control Electronics will immediately start the disconnect process. It is paramount that the failed AC power input be totally disconnected from the output prior to connecting the alternate side power source to the Load. Otherwise, current would be transferred from the Alternate power Source to the Primary power source, which could be at a very low impedance (for example, the whole AC grid). So, knowing that it has taken a couple of milliseconds to verify that a failure has happened, another two milliseconds (plus a little buffer insurance of 1 millisecond) is desirable to ensure that the Input Relays and the Gatekeeper Relays have had sufficient time to mechanically open. As mentioned before, this time is on the order of 2 milliseconds average. Thus, the command to "Force Disconnect" the primary side (A in this example) is immediately issued along with the GK to A control lead being de-asserted. This starts the process of disconnecting from the A side. It is assumed that the IGBT Drive for the A side has long since been removed, preferably about 200 ms after it was asserted long ago when power was initially transferred to the Primary side.

The Digital Control Electronics must now wait patiently for at least two milliseconds. The ATS Digital Control Electronics actually waits 3.5 ms, with the relays we are currently using, but this value is programmable into the Digital Control Electronics, and may change depending on the relays sourced for use in these ATS units. But it does wait until it is sure that enough time has passed that the mechanical relays have opened the path from the previously connected Power source and the output. At this point, The Digital Control Electronics can assert the IGBT Drive B and the GK to B signals and connect the load to the alternate power source as described in the connect sequence above.

When the IGBT drive is off, and the opto-couplers are not turned on, there is no current source to keep C33 (C47) charged and they decay in voltage down from wherever they were until these capacitors are fully discharged via resistors R2 and R4. At this point, the bases of Q 13 and Q2l are at the collector potential. Q13 and Q21 are Darlington coupled transistors and have gain characteristics in excess of 20,000. Any attempt to raise the voltage on the emitters of these transistors Q13 and Q21, will result in immediate conduction to the collector potential. In other words, the Gates of the IGBTs Q 2 and Q3 are shorted to their Emitters. This is necessary. Because the Collectors are connected indirectly to the output of the ATS via the Bridges BR2 and BR3, when the IGBTs on the Alternate side do come on, and deliver AC to the Load from that side, they will turn on very fast. The resultant very high rate of voltage change at the output will appear at the Collectors of the now off IGBTs Q2 and Q3. Without the very low impedance clamp on the Gates of the IGBTs Q2 and Q2, the high rate of rise at the Collectors will try to turn on the IGBTs through the capacitive coupling internal to the devices. The higher the rate of rise of the voltage, the more susceptible the IGBTs are to false turn on. Thus, the ever-present clamp across the Gate to Emitters of the IGBTs when they are off This unique IGBT drive scheme is both simple and robust. It requires no external power to operate. Switching on the alternate side from IGBT Drive B and GK to B are mirrored in function to the A side.

Figure 4:
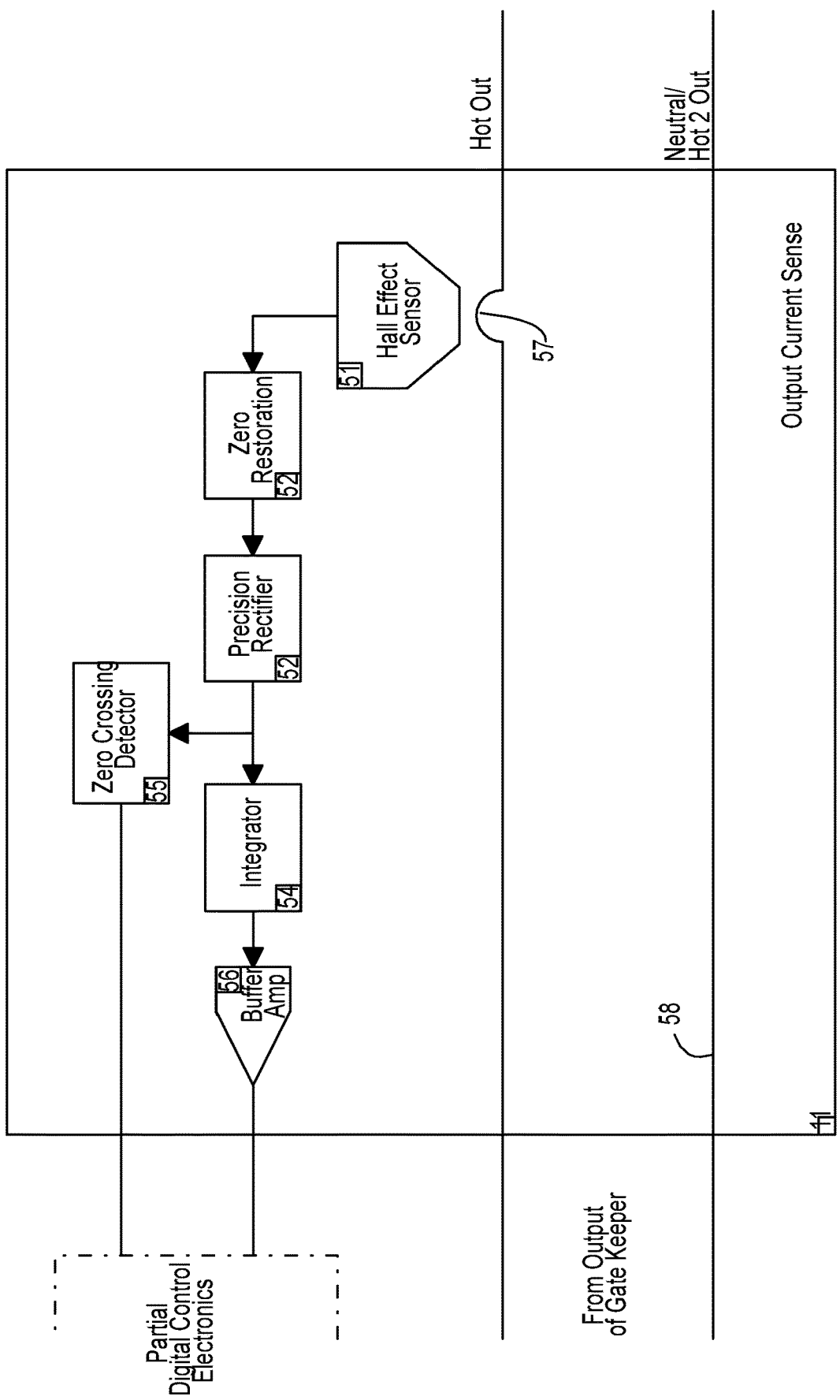
FIG. 4 is a Current Sense block diagram providing an overview of the current sensing apparatus associated with detecting the output current of the ATS in accordance with the present invention.

FIG. 4 shows how the ATS monitors current and retrieves data necessary for synchronization of zero crossing using the output current. As an ATS, the decision to transfer a load from one active AC power source to another active AC power source requires additional considerations other than performing the transfer as quickly as possible. Since both AC sources are present, there may be additional considerations to make when deciding when to disconnect from the active source delivering power to the load, and then connecting it to the active AC source that is considered the Primary source. This event occurs every time there is a power outage on the primary source, the ATS transfers to the alternate source, and then eventually the Primary AC power source is restored. AT this time, the transfer the ATS must make is from one good source to another good source.

It is necessary to make the opening of the relay occur at or near the zero crossing of current when disconnecting a load from an active AC source. This helps fervent contact arcing, and extends the life of the relay contacts. In the ATS described here, the Disconnect Relays in the Disconnect Switch and Sync Section do not have solid state bypass circuits to unload the current from the relay contacts during a disconnect. Thus, the disconnection must be synchronized with the zero crossing of the current in the circuit.

The ATS described herein can deliver power to a variety of load types. One such load type is what is referred to as a reactive load, often found where the load has capacitance, inductance, or a combination of both. When there is capacitance or inductance in the circuit, the voltage and current waveforms are not synchronous. The power flow has two components—one component flows from source to load and can perform work at the load and the other component known as the "reactive power", is due to the delay between voltage and current, referred to as phase angle, and does not do useful work at the load. It can be thought of as current that is arriving at the wrong time (too late or too early). This phase difference between the actual voltage zero crossing and the zero crossing of the current requires that, since the relay contacts can be damaged by current, not volts, it becomes necessary to cause the relay contacts to open at the time that the current is passing through the zero. Since this can be different timing from the zero crossing detected in the Disconnect Switch and Sync Section, an alternate method of determining the timing of the relay opening, and it must be based on the current flow instead of the voltage present.

When power is present on both sources, and a transfer is imminent, the Digital Control Electronics must measure the output current, and if it is significant, use this to determine when to open the various relays in the path of the current flow. In the ATS described here the Digital Control Electronics has tables loaded into its memory at the time of manufacture that contain the measured time between the command to release a given relay, and when it successfully opens the contacts. Generally, this time is about 2 milliseconds, but it can vary significantly due to manufacturing variables. Thus, the Digital Control Electronics keeps track of the delay times for each of the relays in the ATS, and can use that information to calculate the exact disconnect time when preparing to disconnect the load from an active AC source.

The Digital Control Electronics also has determined the time from one half cycle to the next by measuring the rising edge to the rising edge of the sync pulses generated in the Disconnect Switch and Sync Section. By using this information, the Digital Control Electronics can now subtract the known delay of a given relay from the time between half cycles and arrive at a number that is predictive of when the relay contacts will start to open, relative to a zero crossing of current. The Digital Control Electronics will prepare to make the relay opening, then at the next zero crossing of the current will then delay the amount of time calculated by subtracting the relay opening time from the half cycle to half cycle time, then the Digital Control Electronics issues the disconnect command.

In this manner, the ATS described here can disconnect a load very close to the actual zero crossing of the current by performing these predictive calculations. This minimizes the degradation of the electrical contacts within the relays. In addition, conditions could exist that prevent a relay contact from releasing when the command from the Digital Control Electronics commands it to disconnect. The most common cause of this is a welded contact that is the result of some excessive current during the prior transfer. Other conditions could include mechanical wear or degradation of materials due to time, heat or other causes. In any of the cases where a contact has not operated in the manner desired by the Digital Control Electronics, a method is described here that allows the Digital Control Electronics to detect that fault condition. If the fault condition is detected before the commands are issued for any additional relay or SSR action, then a shorting of the A side power source to the B side power source can be avoided. In much large Automatic Transfer Switch applications, traditional ATS designs, this is accomplished by mechanically linking the power contacts of the relay to an auxiliary set of contacts that can be monitored by the Digital Control Electronics for this authentication process. In the case of the MINI ATS application described here the physical size is of significant concern. A novel means of detecting the operation of the relay is described here, referred to as the Relay Operation Authentication Detector, that allows this authentication, while maintaining a small form factor. In addition, this detection means is directly involving the active electrical conductive portion of the relay that actually passes the power through the relay. By detecting on that specific electrical conductor, there is positive confirmation of the state of that contact, either connected to the power source or not connected. When the Digital Control Electronics commands either the closure of the desired relay or opening of the desired relay, this authentication feature allows the Digital Control Electronics to immediately check the results of that action request and verify it has completed before moving on to performing any other actions. In the event of detecting a failure to complete the command by the relay in question, the Digital Control Electronics can then undergo a process to halt any additional actions, report this fault event to the monitoring controller, and it can perform multiple attempts to operate the relay and possibly self-repair the electrical fault by breaking loose the potentially welded contact. In that event, the Digital Control Electronics can then elect to return the entire MINI ATS to operation, or place it in a safe state such as totally shut down. The determination of what to do with the fault condition is fully programmable and can be specific to various applications. This flexibility offered by implementing the authentication is unique in Automatic Transfer Switches.

In addition, the authentication circuits allow the Digital Control Electronics to operate in a mode where the next step is not determined by time as described earlier, but by what state the various components are physically, or electrically in. For example, when the command to disconnect the relay from one source is issued, instead of calculation when it should have disconnected, to allow proceeding, the Digital Control Electronics simply waits for the authentication signals from the affected relays to indicate a successful completion of the action. The Digital Control Electronics merely has to put a timed limit on that so detection of a fault can be determined. But being a state controlled process means that the next action that is dependent on the upcoming change of state is timed to the optimum time when that next action can commence.

FIG. 4 shows the basic electrical and electronic components of the Current sensing section of the ATS. The primary sensing element is a Hall Effect sensor 51 adjacent to the Hot Out Lead that is attached to the output of the ATS. The magnetic fields generated by the passing current 57 is detected in the Hall effect sensor 51 and amplified. Zero restoration 52 of the sensed signal is necessary to stabilize the conversion from AC measurement to DC in the Precision Rectifier 52. After the Current waveform has been rectified, it is still returning to zero every half cycle. At the moment it returns to zero, the Zero Crossing Detector 55 output asserts. This signal is sent to the Digital Control Electronics for use in calculating timing. In addition, the rectified current output of the Precision Rectifier 52 is also sent to an integrator that consists of an array of capacitors and resistors that smooth out the sensed current and convert it to a smooth DC level. That DC level then is sent to the Digital Control Electronics via a buffer amplifier, and enters the Digital Control Electronics through an integrated Analog to Digital Converter for digital processing and reporting of the current levels to the communication port, and eventually to the remote monitoring equipment.

The Digital Control Electronics also uses the integrated DC levels to determine if the ATS should turn on the light that warns of "maximum load acceptable." A feature of the ATS described here is its ability to set a warning light when the load is above a pre-programmed level.

Another action that the Digital Control Electronics can perform using the integrated DC level is to shut off the output in the event of an overload. If the current exceeds a pre-programmed level, the ATS can de-energize the Gate Keeper relay very quickly to protect the AC power circuit. The Digital Control Electronics can then turn on another warning light to indicate that an overload has occurred, and it can send status data through the communication port to the remote monitoring equipment.

Another feature of the ATS described here is its ability to set a warning light when the load exceeds a pre-programmed level, and turn off power to that load coincidentally.

A reset button (FIGS. 8, 9, 10, item 104) is provided as a means for the operator to reset a Load-Fault condition once the fault has been removed.

Unique filtering at the hardware level in the integrator 54 and software computations by the Digital Control Electronics allow a precise imitation of any fuse curve desired, or any circuit breaker desired.

The output current sense discriminated by the Digital Control Electronics can also be used to predictively operate the cooling fans. Instead of waiting until the interior of the ATS has heated up due to heavy loading, and then turning on the fans, the Digital Control Electronics can predict the internal heating due to detected load in the current sensor 11. Thus, the fans come on before individual components become hot. This feature can be useful in improving the reliability of the ATS.

The ATS can be predictive about internal heating and start the fan(s) proactively to reduce materials fatigue and improve reliability.

Figure 5:
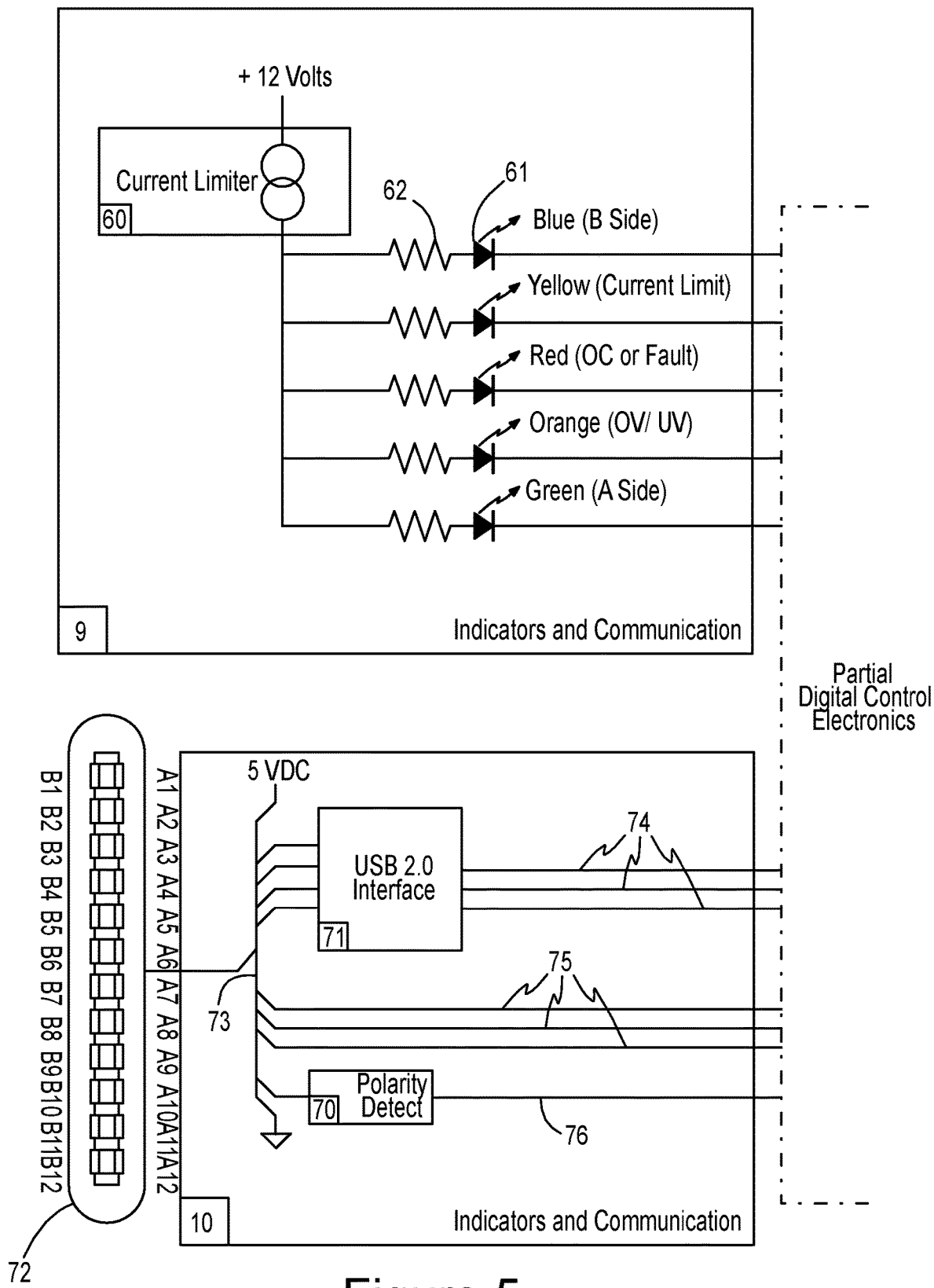
FIG. 5 is an Indicators and Communication block diagram providing an overview of the communication apparatus and indicators used in the ATS in accordance with the present invention.

FIG. 5 shows the overview of the Indicators 9 in the ATS, and the Communication port 10.

The Indicators are generic LEDs of various colors. Utilizing state-of-the-art components, bright and efficient LEDs provide excellent indications of the various statuses of the ATS described here. The unique crenelated lens assembly allows effective airflow as well as an excellent range of angles of visibility of the LEDs.

In addition, a current limiter 60 is in the path of the electrical supply for all of the LEDs. This prevents overloading of the power supply in the event that 3 or more LEDs are illuminated simultaneously.

The Communication portal 10 provides a specialized communication set between the Digital Control Electronics and the remote monitoring and control electronics.

Three functions are provided by this port, but others could also be implemented.

i. USB communication with the remote monitoring and control electronics.

ii. Connection between the Peripheral Interface Controller (PIC) (a type of MCU) internal to the ATS described here, and an external programming tool. This allows updating the software (firmware) of the PIC without having to open the case up. There may be customers that have ATSs as described here that require special functions. Due to the unique design of this ATS, these client needs may be met by supplying specialized operating code to the Digital Control Electronics of this ATS.

iii. Connection between the Digital Control Electronics and external communication interface converters to allow long line communications to remote monitoring and control electronics. USB has short length limitations and as such may not be applicable to all communications requirements.

The Digital Control Electronics can send data via USB to the remote monitoring and control electronics via the USB 2.0 interface converter 71 through the panel accessed USB type C connector 72. A USB type C connector is selected for it's unique pairing of pins that generally allow the connector to be mated in either polarity. The pins from one side of the connector are mirrored on the other side of the connector so that regardless of which way the mating connector is inserted, the communication and voltages sent through the connector system will be preserved. The ATS described here leverages this bi-polar characteristic for an added feature. By flipping the connector, that flip can be detected and send an alert signal 76 to the Digital Control Electronics via a Polarity Detect circuit 70. The Polarity Detect circuit operates by detecting if a ground pin is present on one of the pins. The complement pin (in a reversed condition of mating the connectors) is connected, instead, to the +5 volts pin of the connector. In this manner, the orientation of the connector can be determined by the Digital Control Electronics. This is useful by allowing the Digital Control Electronics to determine if it should be communicating via USB, or if it should be preparing to accept data from a remote programming tool. This feature also can be used to alert the operator that the connector is flipped. This can be used to help improve the security of the data contained in the Digital Control Electronics. By flipping the connector one way, a physical barrier to writing data into the Digital Control Electronics. However, flipping the connector the other way allows data to be written to the Digital Control Electronics, while simultaneously the Digital Control Electronics can provide distinctive illumination to the LEDs that alert the operator to this write vulnerability.

Thus, the unique wiring of the USB type C connector allows the ATS described here to communicate with multiple types of external electronics and improve the security of the data stored in the ATS.

Figure 6:
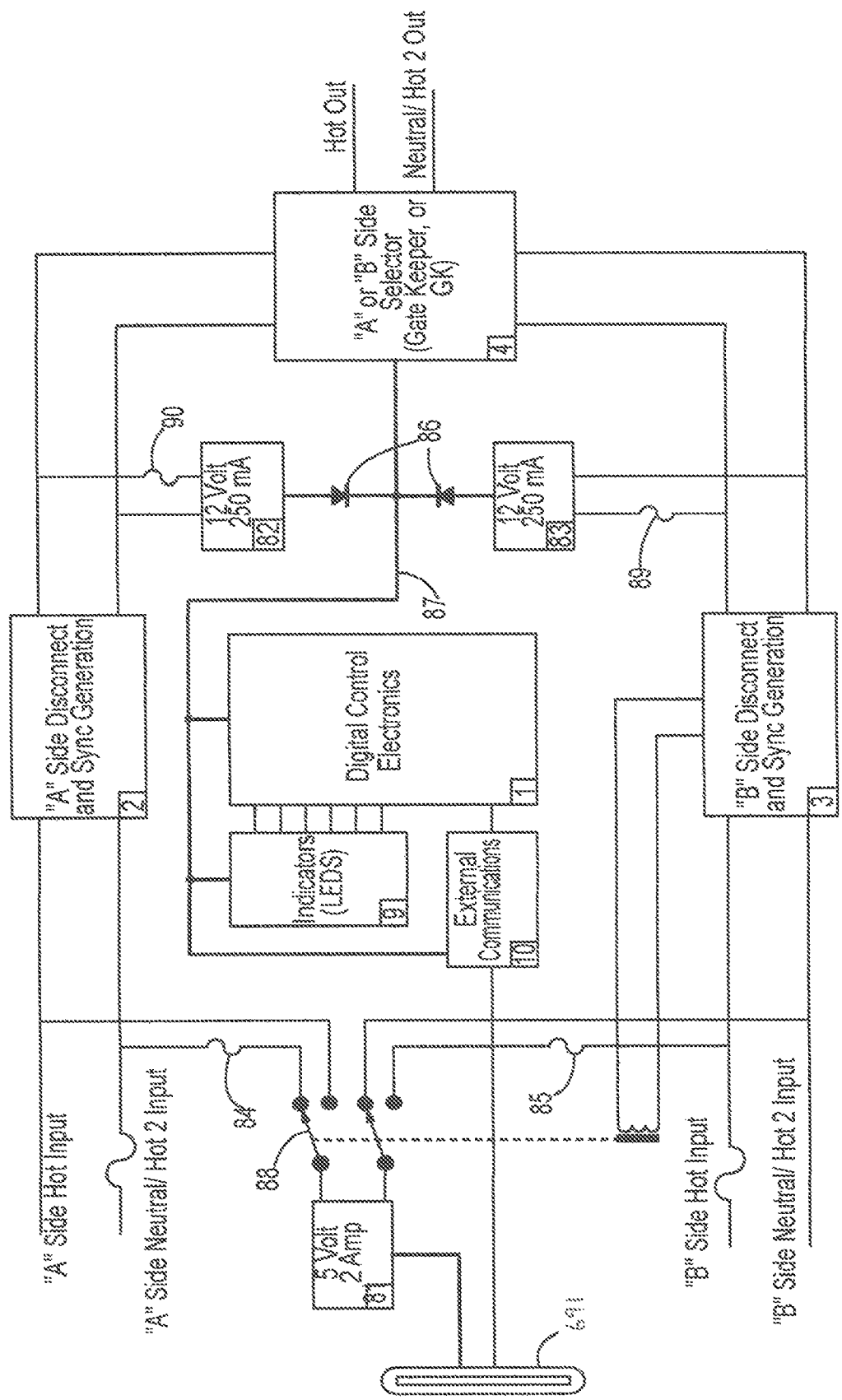
FIG. 6 is a Power Supply block diagram providing an overview of the various elements of the Power Supply system used to power the ATS and the Remote Communications sections in accordance with the present invention.

FIG. 6 shows the overview of the power supply system in the ATS described here. Since it is unknown at any time if power will be present on the A input, the B input or both, a power supply system is included that is both 5 KV isolated from the Digital Control Electronics, but it is available from both the A and B inputs. A 12 volt DC supply is attached to the output of the A Side Disconnect and Sync AC Power out. Also a 12 volt DC supply is attached to the output of the B Side Disconnect and Sync AC Power out. Each of these power supplies are connected to a common+12 bus via isolation diodes 86 that are contained within the power supply modules. These diodes provide the capability of either power supply to operate if one or the other fails. This is a redundant power supply system and is an added feature of the ATS described here.

The 12 volt bus is distributed to the various electronics on Digital Control Electronics 1 and the A or B Side Selector 4 electronics where the 12 Volts DC is reduced, if needed, to 5 Volts and 3.3 Volts as necessary with local regulator chips. The inputs to the 12 Volt power supplies are protected by fuses 89, 90 for safety reasons.

In addition to the local ATS power supply, an auxiliary power supply 81 to deliver power to the USB port 691 is provided. This is a 5 Volt 2 amp supply and again is Isolation Rated to supply power to the USB client devices in accordance with regulatory agency requirements such as the Underwriters Laboratory (UL) and other similar regulatory bodies.

The input to the USB power supply 81 is supplied via a selector relay 88. Each of the inputs to the selector relays have a single fuse in line 84,85 to protect the 5 Volt power supply 81 and to prevent the possibility of a through relay short circuit path between the A side and the B side, in the event of a catastrophic failure of the selector 81.

Figure 9:
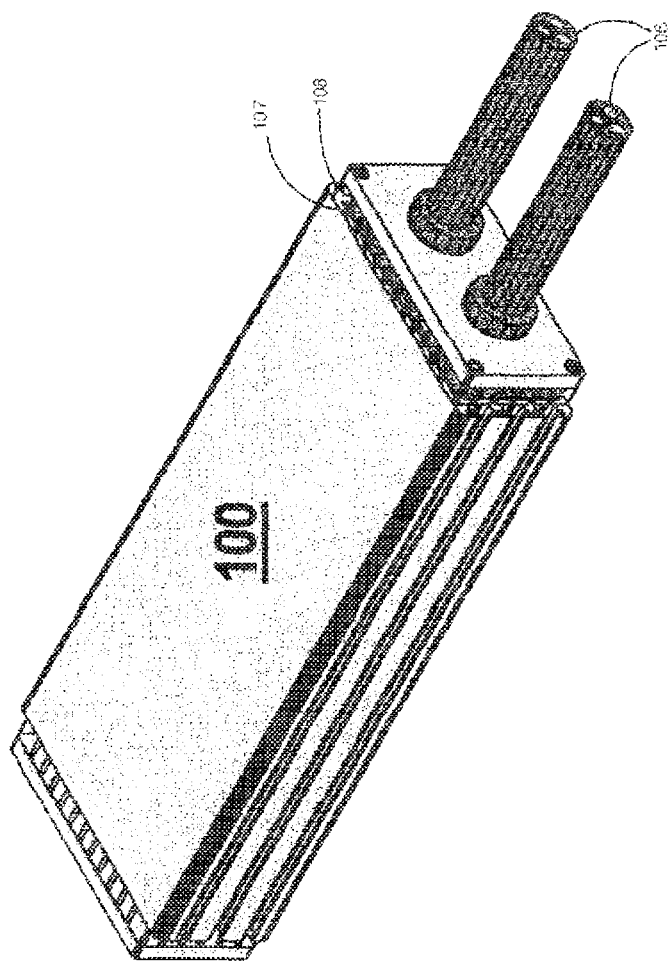
FIG. 9 shows a 30 amp dual IEC type C19 Output, Corded Input ATS in accordance with the present invention.
Figure 9:
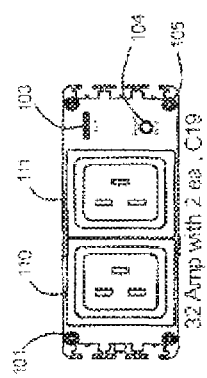
Figure 10:
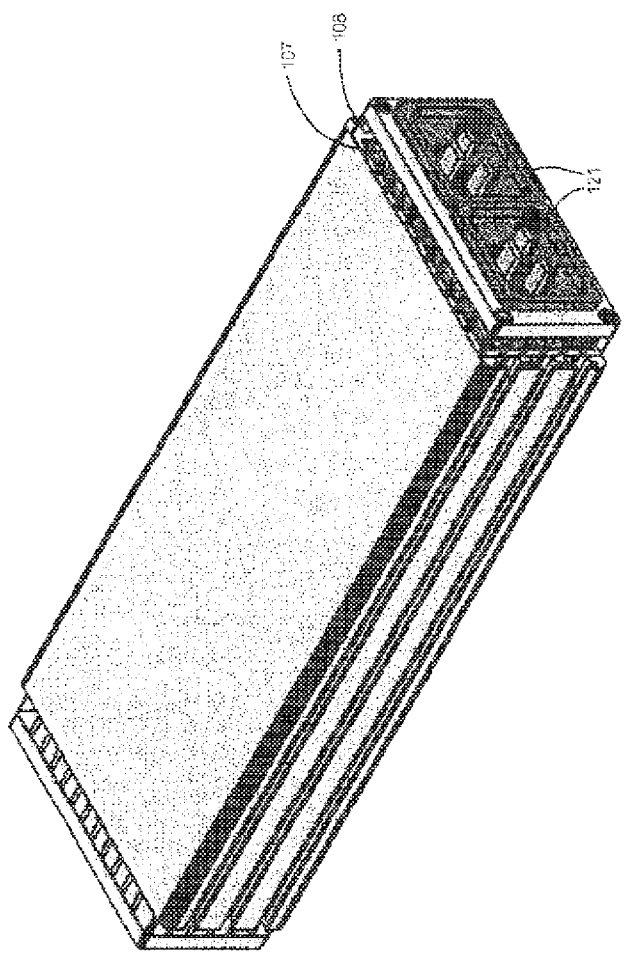
FIG. 10 shows a 20 amp dual IEC type C20 Input, Single IEC type C19 Out ATS in accordance with the present invention.
Figure 10:
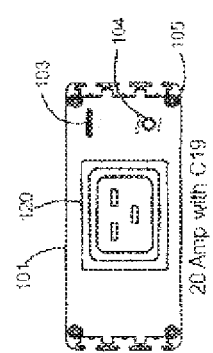

12. FIGS. 8, 9 and 10 show various instantiations of the ATS described here 100.

FIG. 8 shows a variant that has flexible cords entering 106 and exiting 109 the ATS described here 100. This is a 30 amp, or 32 Amp model, but other current handling capacity cordage can easily be applied. Various amperage capacity models differ only in the cords, the connectors on the ends of the cords, the internal main fuse ratings, and the pre-programmed information contained in the memory of the Digital Control Electronics. Voltage range selection is automatic in the main unit 100, but will be largely determined by the plug type installed.

The output cord 109 of the ATS described here 100 exits the end cap 101 through a strain relief bushing 102 that is selectable for the cable size without varying the size of the hole in the end cap. This reduces manufacturing costs.

The output end cap 101 also has the portal for communications 103 described in FIG. 5-72. The end cap 101 also contains the push button 104 for resetting the ATS electronic circuit breaker, or selecting the preferred input.

FIG. 9 shows a variant that has flexible cords entering 106 and a pair of IEC type C19 receptacles mounted in the end cap 101 of the ATS described here 100. This is a 30 amp, or 32 Amp model. Amperage capacity models differ only in the specifications related to the country of usage assigned, the internal main fuse ratings, and the pre-programmed information contained in the memory of the Digital Control Electronics. Voltage range selection is automatic in the main unit 100.

The dual IEC type C19 connectors of the ATS described here 100 are directly mounted in the end cap 101.

The output end cap 101 also has the portal for communications 103 described in FIG. 5-72. The end cap 101 also contains the push button 104 for resetting the ATS electronic circuit breaker, or selecting the preferred input.

FIG. 10 shows a variant that and a pair of IEC type C20 chassis mount plugs 121 on the entry to the ATS described here 100. A single IEC type C19 receptacle 120 is mounted in the end cap 101 of the ATS described here 100. This is a 16 amp model. Voltage range selection is automatic in the main unit 100.

The output end cap 101 also has the portal for communications 103 described in FIG. 5-72. The end cap 101 also contains the push button 104 for resetting the ATS electronic circuit breaker, or selecting the preferred input.

Figure 13:
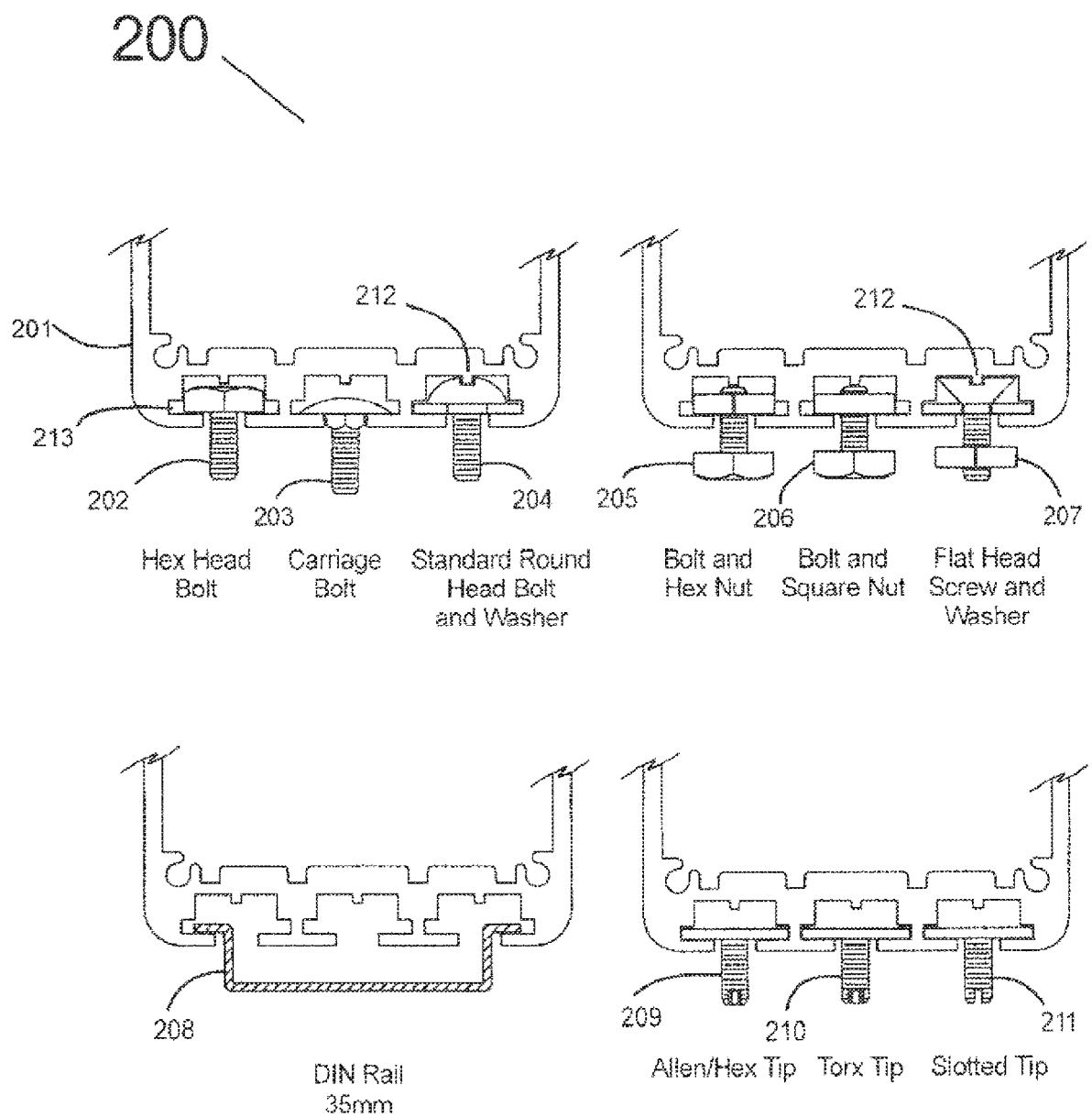
FIG. 13 shows a cross-section end view of the case of an ATS in accordance with the present invention.

FIG. 13 shows a cross section end view of the extruded case 201 of the ATS described here.

The case has numerous features including:
i. Extruded aluminum for strength and durability
ii. All metal construction minimizes electrical and magnetic interference problems
iii. Slots on each side of the case with ample surface area for dissipation of heat
iv. Slots on each side for mounting.

The slots on the sides are configured at "T" slots, meaning that the slot has a small cavity behind the slot that facilitates ease of mounting with a variety of hardware. The size and shape of these "T" sots is optimized for use with off-the-shelf mounting hardware. Generally speaking, "T" slots are commonplace, but in this instantiation the slots have additional features that make them unique.

The slots are extruded for the whole length of the case. This allows mounting fasteners to be inserted from either end and positioned laterally along the length of the ATS to facilitate locating adjoining holes in mating apparatus such as computer racks, clamp assemblies, flexible hinges, and so on. In addition, the spacing of the slots with respect to each other is such that a standard off-the-shelf DIN rail can be inserted directly.

In addition, each slot also has a rib along the centerline 212 that acts to engage with the slot in standard round head and flat head screws.

In addition, the slots have relief grooves 213 in the sides of the slots that facilitate a standard off-the-shelf flat washer when fastener hardware has variable size head flange widths.

In addition, the sides of the slots are sized so they are just a little wider than standard off-the-shelf hex nuts of the size appropriate for mounting to data center racks.

Some fastener types that this improved "T" slot system can accommodate, but are not limited to are listed below:

| | |
|---|---|
| #10 × 32 Hex Head bolt | 202 |
| #10 × 24 Hex Head bolt | 202 |
| M5 × .8 mm Metric Hex head bolt | 202 |
| #8 × 24 Hex Head bolt | 202 |
| #8 × 32 Carriage head bolt | 203 |
| #8 × 32 Standard round head screw with washer | 204 |
| #10 × 24 Standard round head screw without washer | 204 |
| Hex Nut, #8 and #10 | 205, 206 |
| #8 × 32 flat head screw and washer | 207 |
| #8 and #10 Allen or Spline socket tip screws (non standard) | 209 |
| #8 and #10 Torx socket tip screws (non standard) | 210 |
| #8 and #10 slotted tip screws | 211 |

The ability to utilize a wide variety of mounting hardware styles, along with the slots being the full length of the enclosure, and the included ribs that prevent round head and flat head screws from turning inside of the slot make mounting this product versatile and convenient.

Figure 14:
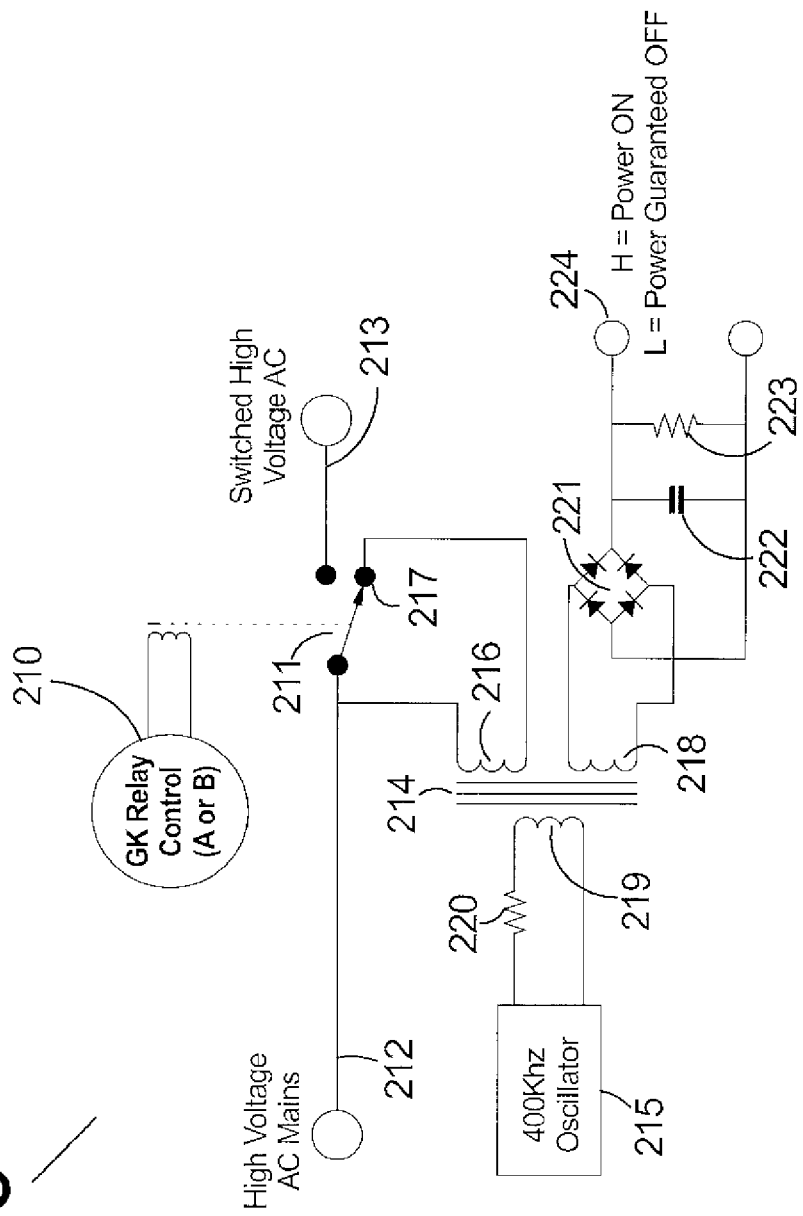
FIG. 14 shows components of a relay contact authentication detection module in accordance with the present invention.

FIG. 14 shows the general principal components of one relay contact operation authentication detection 400 that comprise the Relay Operation Authentication Detector section of the MINI ATS.

AC power 212 is present always on the armature of the relay 211. When a command from the Digital Control Electronics is initiated through the GK Relay Control 210 the relay 211 will move the armature to the Switched High Voltage output leg 213 of the relay 211. This is the normal power path for operation of the relay switch. There are four such switches in the Mini ATS that comprise switching of the Hot and neutral (or secondary Hot) of the A side, and the Hot and neutral (or secondary Hot) of the B side.

The relay contact detection circuitry consists of a very small pulse transformer 214 designed to operate at low voltages, such as 5 volts connected across the armature of the relay 211 and the unused normally closed contact 217 of the relay 211. The windings 216 of the pulse transformer 214 are thereby normally shorted out by the normally closed position of the relay 211 when it is not actuated and no power is being sent through the relay from the input 212 to the output 213.

At all times, a small 400 Kilohertz (KHz) oscillator 215 is operating. This frequency can be anything appropriate to the characteristics of the selected pulse transformer 214 and could vary from various applications to another. For the use in the MINI ATS, a transformer that operates well at 400 KHz is selected due to its small size and efficiency. The output of the oscillator 215 is connected to the pulse transformer 214 through a current limiting resistor 220. Thus, when the set of windings 216 are shorted due to the position of the contacts of the relay 211, the windings of the oscillator connected side of the transformer 219 are also shorted out. Most of the output power of the oscillator 215 is dissipated in the current limiting resistor 220. Subsequently, the windings of the pulse transformer 218 that are connected to the bridge rectifier 221 have very little signal transmitted there also. Thus, no voltage is developed across the capacitor 222 and the bleed down resistor 223. The voltage output at 224 is essentially zero. Thus, a zero output voltage represents that the relay 211 contacts are in the open condition with regards to the power path.

When a command from the Digital Control Electronics is initiated through the GK Relay Control 210 the relay 211 will move the armature to the Switched High Voltage output leg 213 of the relay 211 and thus remove the short condition on the winding of the transformer 216 the moment that the armature of the relay 211 leaves the contact 217 when the coil of the relay is energized. When the short condition on the winding 216 is removed, the oscillator 215 output can now energize the input winding of the pulse transformer 219 and the 400 KHz will be transmitted through the pulse transformer 214 to the output winding 218. The AC will be rectified in the bridge rectifier 221 and filtered by the capacitor 222. Thus, an output voltage represents that the relay 211 contacts are on their way to or at the closed condition with regards to the power path and allowing the relay to pas power from the input 212 to the output 213. The selection of the winding ratio and the operational voltage of the oscillator 215 determine the output voltage of the bridge rectifier 221. In this instantiation the output voltage selected is 5 volts and is directly compatible with the electronics in the Digital Control Electronics.

A bleed down resistor 223 is connected across the filter capacitor 222 to deplete the voltage there when the output of the pulse transformer 214 ceases to deliver voltage due to a short condition returning to the relay 211 contact closure where connected to the Normally Closed contact 217. This bleed down is very fast since the filter capacitor is selected to be only big enough to ensure consistent output voltage during the transition from positive to negative on the output of the transformer 214.

When the command from the Digital Control Electronics to disconnect the AC power path through the relay 211 occurs, the relay armature transitions from the Normally Open contact position 213 to the normally closed contact 217. For the pulse transformer relay switch position sense winding 216 to become shorted out and thus signal successful completion of opening of the power path, the armature must physically become disconnected from the output. This increases the reliability of accurately detecting the state of the relay.

In addition, because the transformer is connected only to the unused Normally Closed contact 217, the circuit operates efficient and autonomously from whatever voltages or frequencies are present on the power path.

Figure 15A:
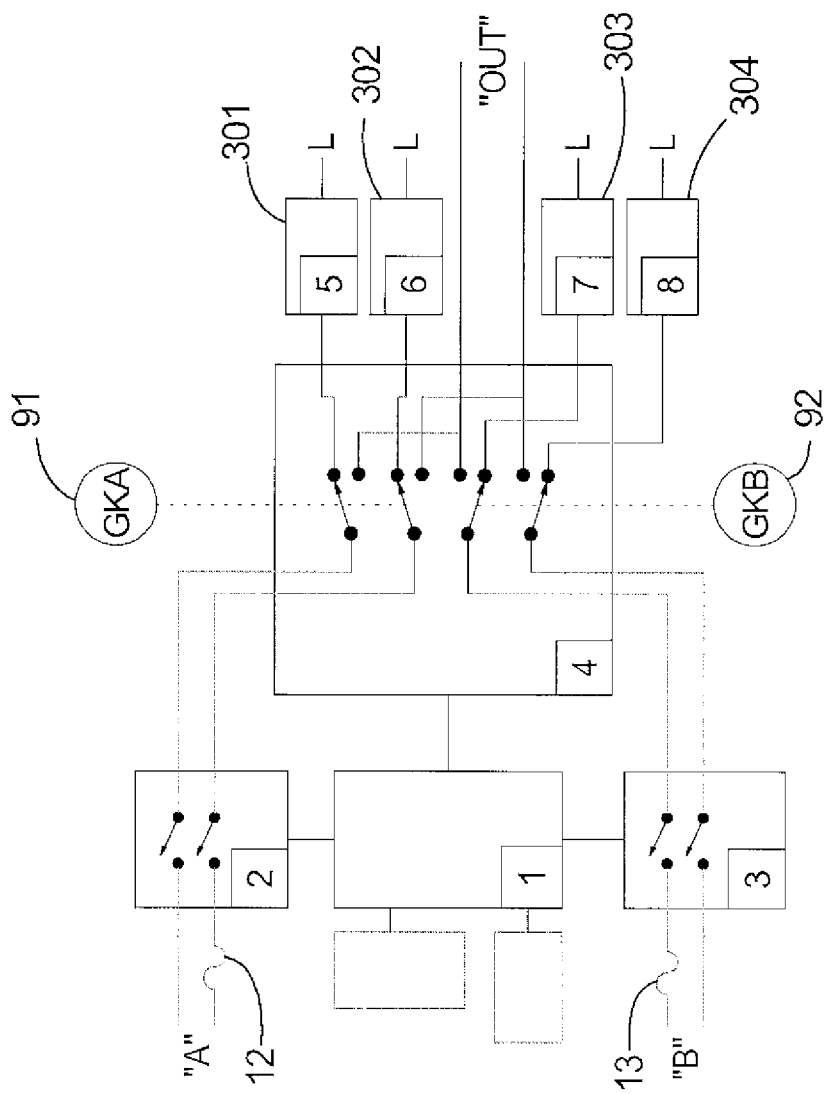
FIG. 15 shows block diagrams of an ATS including relay operation authentication functionality in accordance with the present invention.

FIG. 15*a* shows the basic block diagram of the Mini ATS now including the Relay Operation Authentication Detectors 301, 302, 303 and 304. It shows the device with no input to output connections such as would be the off condition of the Mini ATS. Note that there is no power path shown connected from either input to the output. Also note that the output of each of the Relay Operation Authentication Detectors is represented by an L, for Low, or no voltage from the detectors within each Relay Operation Authentication Detector section. Each of the four Relay Operation Authentication Detector relays are now in the Normally Closed position (non-energized) states, and thus the contact sense windings of all four are shorted.

Figure 15B:
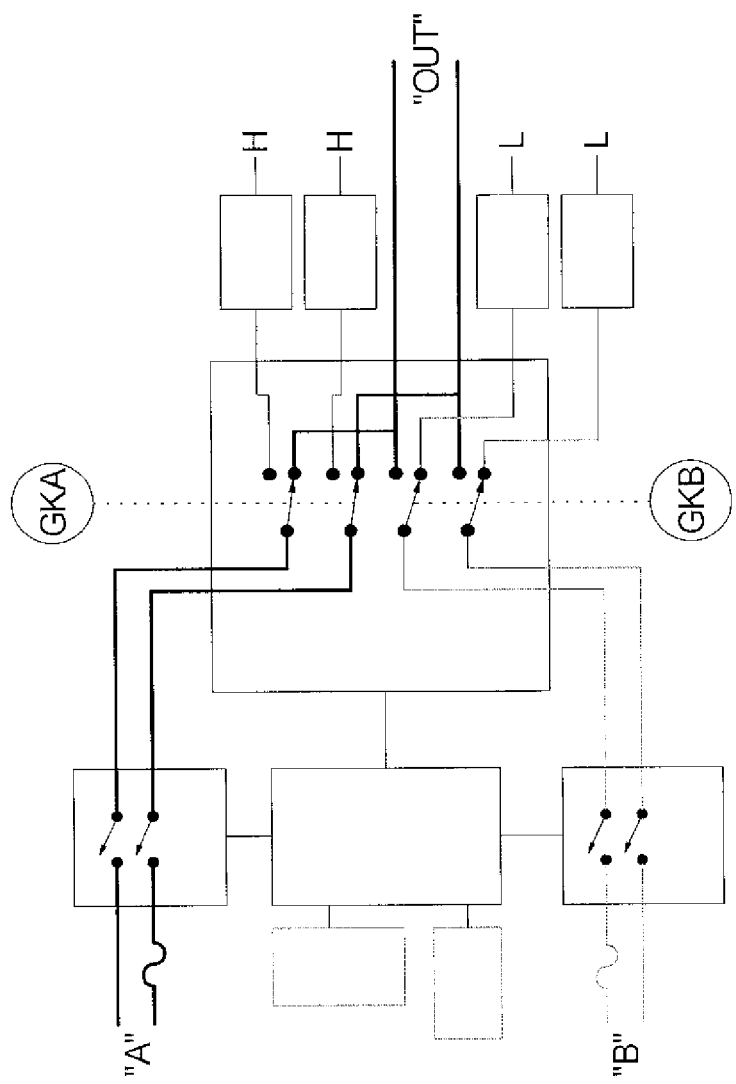

In normal operation, one or the other of the inputs will be connected to the output. FIG. 15*b* shows that, in this case, the input "A" is connected to the output "OUT". Now, each of the outputs of the Relay Operation Authentication Detectors associated with the "A" side 301 and 302 are now outputting a high signal represented by an H for each. This hi signal is sent to the Digital Control Electronics where it can verify the state of the relays and can continue to operate normally. Each change of state commanded by the Digital Control Electronics can be monitored and authenticated by the Digital Control Electronics in this manner.

Figure 15C:
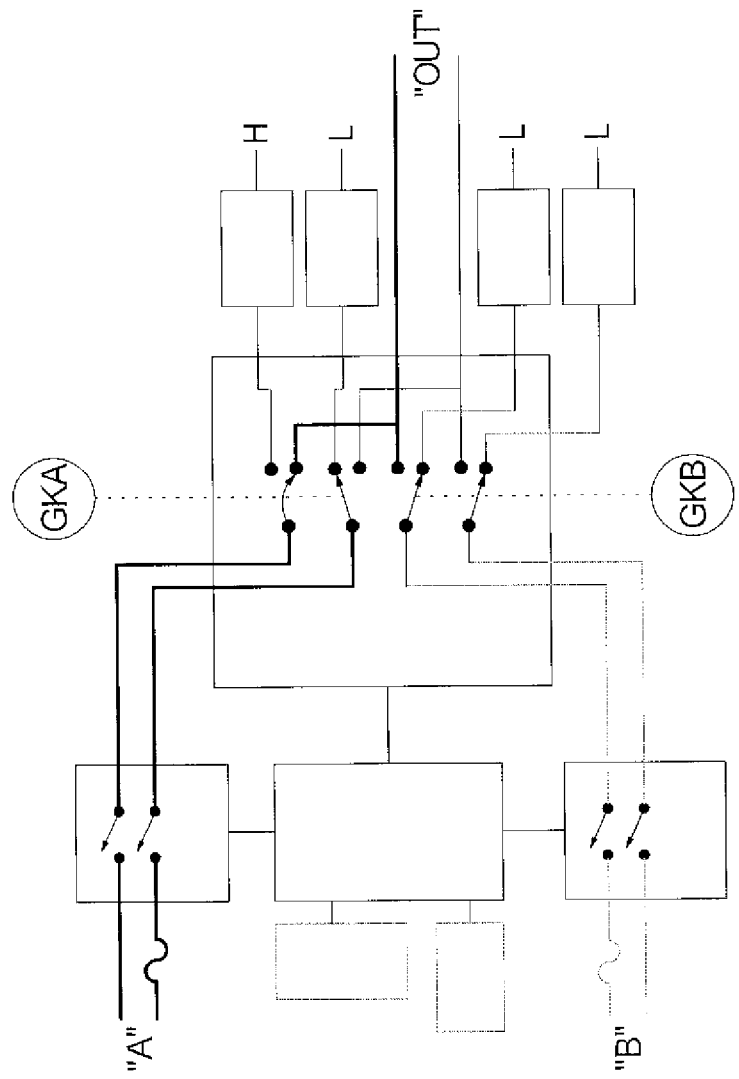

FIG. 15*c* shows a possible fault condition where the Digital Control Electronics is commanding the A side Gate Keeper relays to disconnect via the Gate Keeper Amplifier 91 by turning off power to the relay. But the Normally Open contact on the Hot side is shown diagrammatically as being "stuck" to the output connection. The complementary relay has successfully opened. Thus, the output from the Relay Operation Authentication Detector for that relay contact remains in the "High" state, thus signaling the Digital Control Electronics that the operation to disconnect that relay contact has failed. This allows the Digital Control Electronics to take appropriate steps and not apply power to the Gate Keeper amplifier on the B side thus potentially causing a hazardous short of the A side to the B side.

It is possible now for the Digital Control Electronics to repeated turn on and off the affected relay and monitor the state of that Relay Operation Authentication Detector. It is possible, even likely that repeated operation of the relay will eventually cause the stuck contacts to dislodge. The unit reliability is subsequently improved by this self-healing potential of this design.

Figure 16:
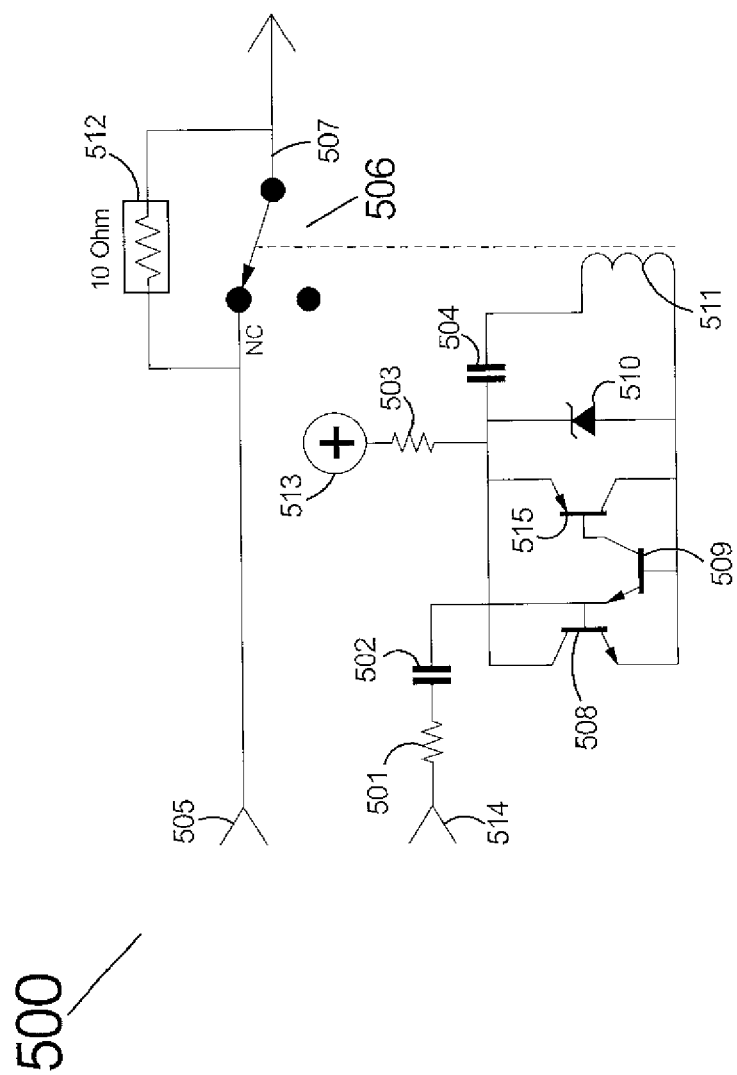
FIG. 16 shows a circuit for implementing an inrush limiting function in accordance with the present invention.

FIG. 16 shows several methods for increasing the uptime and maintainability of an SBC module that is acting as the control module either standalone or as part of a larger device. Several of the ATS instantiations described herein can be used to eliminate power-related downtime. It allows single power supply SBC modules and other critical loads to be fed by both filtered utility line power and a UPS, or two UPS units, with either as the primary or backup power source. If possible, the UPS can be plugged into a different branch circuit than the second input to the µATS™, allowing the UPS to be taken out of service for maintenance or testing without SBC downtime. With this configuration, both the utility line power and the UPS must fail at the same time to result in downtime. The figure below compares the traditional methods of powering an SBC module to those possible with a suitable ATS.

FIG. 16 describes one possible instantiation of a novel method to activate the inrush limiting function that can be used in ATS units, as described in this filing or other possible ATS instantiations.

The sub-assembly 500 is comprised of a relay 506 in the path of the AC power that exits the ATS. The power that is delivered to the output of the uATS or the Industrial uATS must pass through this relay. Across the input 505 and the output 507 of the relay 506 is connected a low value resistor 512, approximately 10 ohms. This resistance can be fixed, or it can be of a Negative Temperature Coefficient (NTC) type used specifically for inrush applications. In the case of the Zonit uATS and Zonit Industrial products, this resistor is of the NTC variety, and is 10 ohms.

Since the intent of the inrush limiter is to limit the peak current at them moment of the transfer from one source to the other source and then become transparent, the circuit relies on the electronic drive circuits in those products that change the state of the relays that direct the power within the ATS. The signal to the Gate Keeper relays within the ATS can be used to signal this Inrush limiter circuit to operate. When transferring to the alternate power source in the ATS, a drive signal of 12 to 48 volts is applied to a steering relay, known as a Gate Keeper or GK relay. When the transfer is back, the signal to that GK relay is removed and the relay then connects the AC power to the original source. In other words, the drive to the GK relay inside of the ATS product can be used to actuate this inrush limiter circuit 500 for both transitions. At then moment of the transfer, either direction in the ATS product, this inrush limiter circuit actuates its relay 506 momentarily to bypass the AC power through the limiting resistor 512. After a short period of time, 20 to 100 milliseconds in the case of uATS and uATS Industrial products, the relay 506 is de-energized and the Normally Closed (NC) contacts again pass the power from the input 505 to the output 507, thus bypassing the internal limiting resistor 512.

The signal from the ATS product that actuates GK relays is directed to the input of the Inrush Limiter Circuit from connection 514 through limiting resistor 501 and capacitor 502 to the three transistors 508, 509 and 515. If the transition is positive going, current is directed to the base of Q508 and blocked by the reverse emitter of Q509. In that case, Q508 is turned on for a period of time determined by the discharge rate of the capacitor 502 and the limited current from resistor 501. These components are selected to supply adequate turn on current in Q 508 for a period of about 30 milliseconds before the capacitor charges up adequately to stop presenting current to the base of Q 508, thus allowing it to turn off While Q 508 is in the on condition, the collector of Q 508 is pulled to the emitter voltage, turned ON so to say. The low going pulse on the collector of the transistor 508 is coupled through the coupling capacitor 504 to the relay 506 coil 511 thus turning that relay on, and actuating the armature of the relay 506, and disconnecting the short across the inrush limiting resistor 512. AC power must now pass from the input of the inrush limiter circuit 505 to the output 507 via the inrush limiting resistor 512. After a period of about 30 milliseconds, the charge that was stored in the coupling capacitor 504 is nearing depletion, but at that time the drive signal from the transistor 508 turns off, thus releasing the drive to the relay 506. At this time, the coupling capacitor is discharged, and now begins recharging through the charge limiter resistor 503 from an internal DC power supply located in the main ATS unit. This method of powering the relay is novel in that it only stores enough energy to actuate the relay for the desired time period, about 30 milliseconds in this case. And this configuration also takes advantage of the fact that after a transfer, the main ATS device will pause for a minimum of about 3 to 5 seconds before another transfer is initiated. This allows the coupling capacitor ample time to recharge slowly in preparation for the next interruption cycle. This imposes very little drain on the main power supplies of the ATS itself Those power supplies are designed to operate at the very minimum power needs of the main ATS product, and were not designed to drive an additional relay directly. Not utilizing the novel power circuit of this invention would impose excessive power draw on the main power supply and possibly affect normal operation of the ATS. This design allows for this circuit to be added to the existing design with little modification to those products other than tapping into the GK relay drive for signaling, connection to the power supply and inserting the relay 506, and resistor 512 in the power path exiting the ATS device.

When the input signal to the inrush limiter circuit 500 goes from the high state to the low state as in the case where the main ATS unit is transferring back to the original source, the falling voltage at the input to the inrush limiter is coupled via connection 514 through current limiting resistor 510 and coupling capacitor 502 to the three transistors 508, 509 and 515. In this case, the falling signal tries to go negative and is blocked by the reversed biased base of 508 thus fully shutting it off Now, the negative going pulse from the coupling capacitor 502 causes forward conduction through the emitter of the negative translation detection transistor 509 from its base which is grounded. At this point the negative transition detection transistor turns on and the collector is pulled towards ground. It is connected to the base of relay drive transistor two 515, which is configured in an emitter follower current amplifier connection to the coupling capacitor 504. Again, as in the opposing scenario, the current through the transistor 515 actuates the armature of the relay 506, and disconnecting the short across the inrush limiting resistor 512. AC power must now pass from the input of the inrush limiter circuit 505 to the output 507 via the inrush limiting resistor 512. After a period of about 30 milliseconds, the charge that was stored in the coupling capacitor 504 is nearing depletion, but at that time the drive signal from the negative translation detection transistor 509 turns off, thus releasing the drive to the relay 506. At this time, the coupling capacitor is discharged, and now begins recharging through the charge limiter resistor 503 from an internal DC power supply located in the main ATS unit in preparation for the next interrupt cycle.

Figure 17:
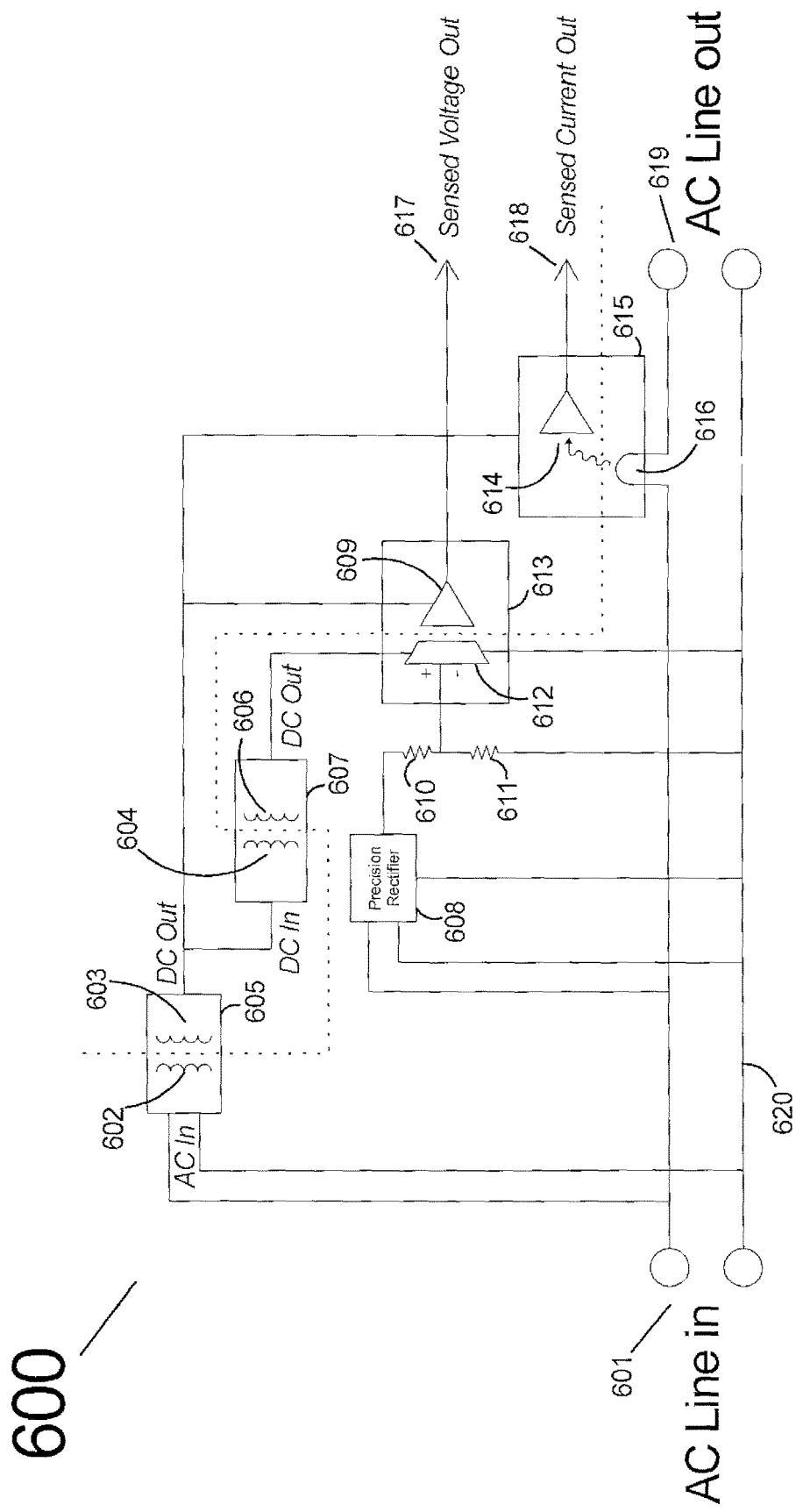
FIG. 17 shows a high definition waveform sensor circuit in accordance with the present invention.

FIG. 17 shows an example instantiation of a high definition (HD) waveform sensor circuit. The key design constrains are small size, low energy usage and very low cost, which is novel, because it enables large numbers of HD waveform sensors to be very widely deployed and that information to be gathered and analyzed. This in turn enables many types of status, diagnostic and predictive analysis for the power distribution system and connected devices, many details of which are described in the Zonit cases. The inventions described in the Zonit cases (e.g., power signal signature recognition) can incorporate this high definition sensor capability for detecting and reporting high resolution (for example 0-100 kHz sampling rates, note zero Hz is DC power) waveform sampling to measure power quality parameters, for example Voltage and Current information regarding the AC power lines that the various devices are connected to both for their inputs and outputs. It can also be incorporated into any of the Zonit inventions referenced herein and also implemented in a plug-in module or other convenient form-factor (many of which are described herein) and include provisions to store and/or communicate the waveform information to other devices via a variety of communication methods, such as wireless, USB, Ethernet and others. These requirements have resulted in the creation of a specialized set of circuits that perform the required function.

The measurement of these AC lines require very high voltage isolation from the digital and analog circuits for safety reasons. Isolation in excess of 3000 VAC is often necessary. In addition, small size is important in the Zonit products, as well as efficient operation. The high isolation buffer/amplifier shown in FIG. 17 consists of an AC power path through the buffer consisting of the AC Line in 601, to the AC Line out 619 via a Hall Effect current sense chip 615.

AC power generally also supplies AC power in to the power supply 605 that generates a DC output that is isolated from the AC mains. The DC output drives the output amplifiers that are connected to the digital and analog sub-circuits that are external. The isolated DC output 603 is also routed to another High Isolation power supply 607 which in turn supplies the input of the voltage buffer 613 allowing the DC input to have a reference to the AC Line 620.

For Voltage detection, the AC line 601 is connected to the precision rectifier 608 to generate a rectified DC output with no filtering for detection. The output of the rectifier is referenced to the AC line 620. The input of the High Isolation buffer amplifier 613 is referenced to the same AC line, 620. The High Isolation buffer amplifier 613 input 612 detects the output of the voltage dividing resistors 610 and 611. The high isolation buffer amplifier 613 then outputs a rectified and scaled Sensed Voltage Output 617 to the external measurement electronics.

Figure 18:
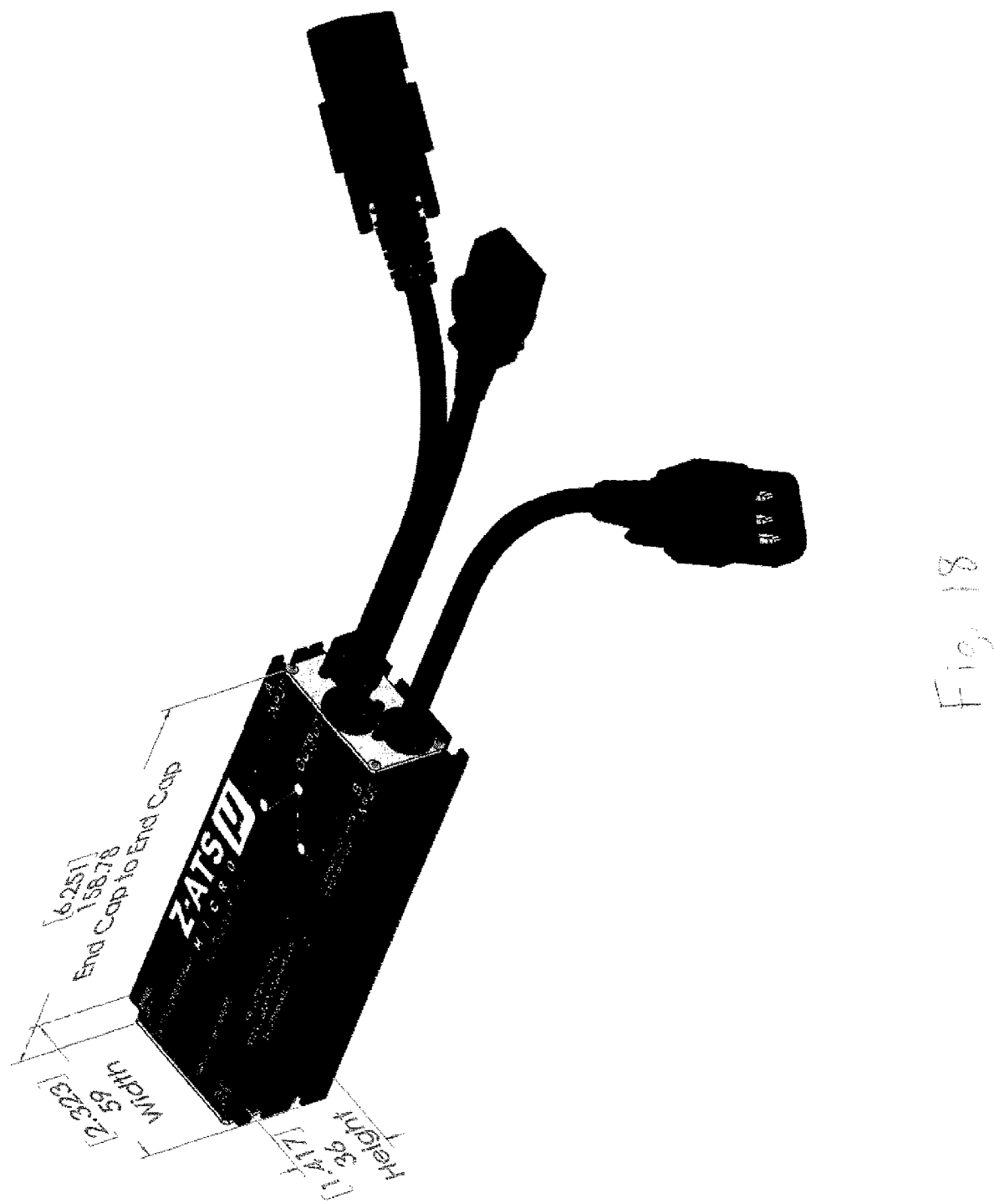
FIGS. 18-20 show a variety of instantiations of an ATS in accordance with the present invention.
Figure 19:
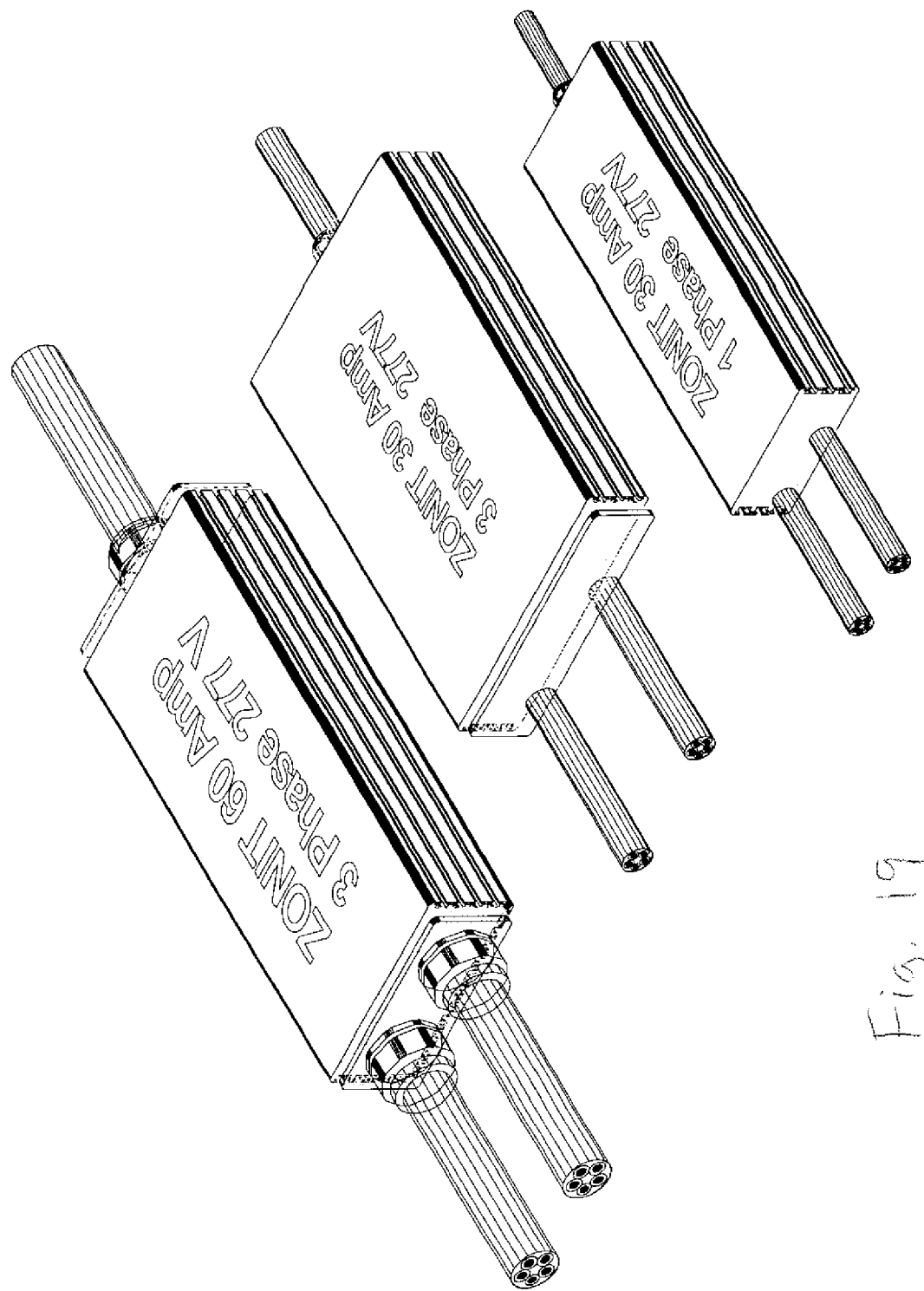
Figure 20:
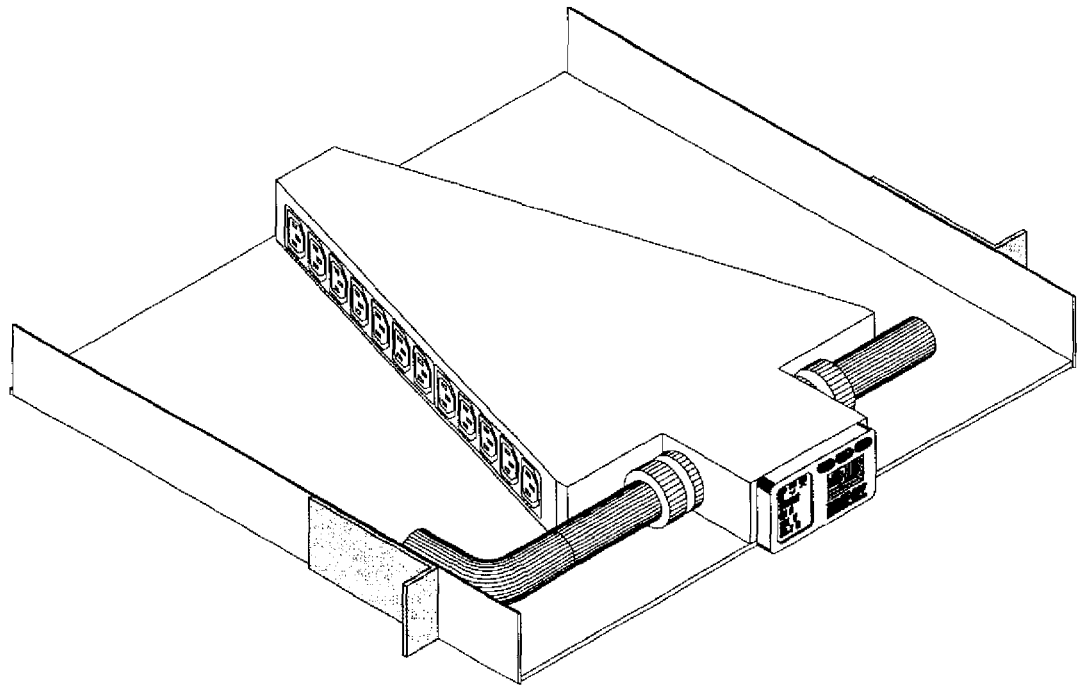
Figure 20:
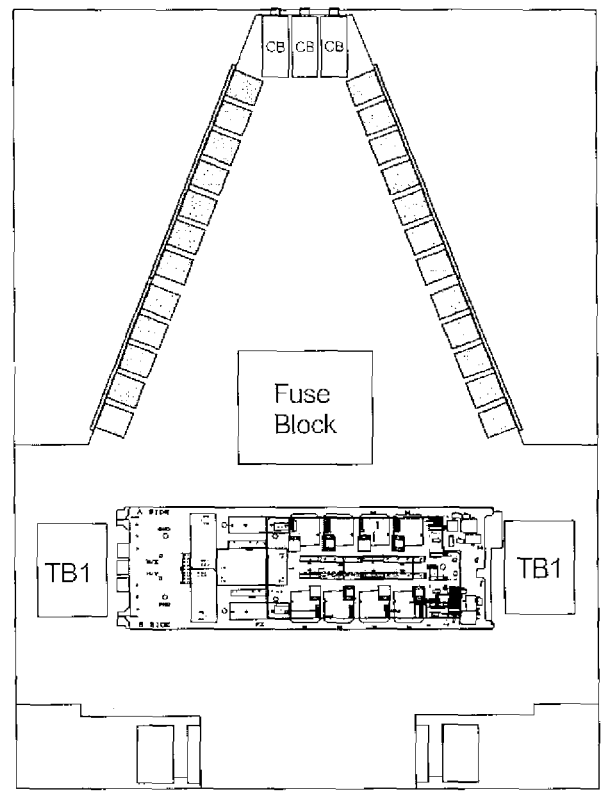
Figure 21:
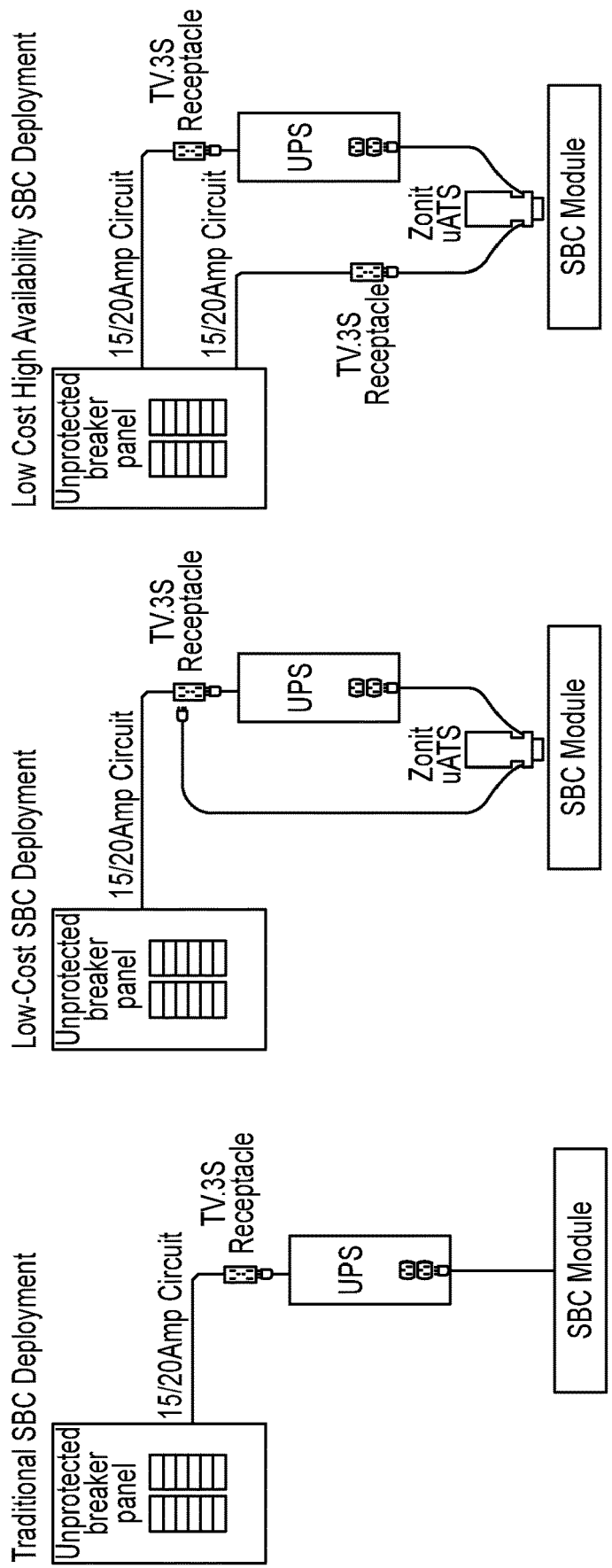
FIG. 21 shows a number of options for utilizing an ATS as described herein to increase the uptime and maintainability of an example SBC control module.
Figure 22:
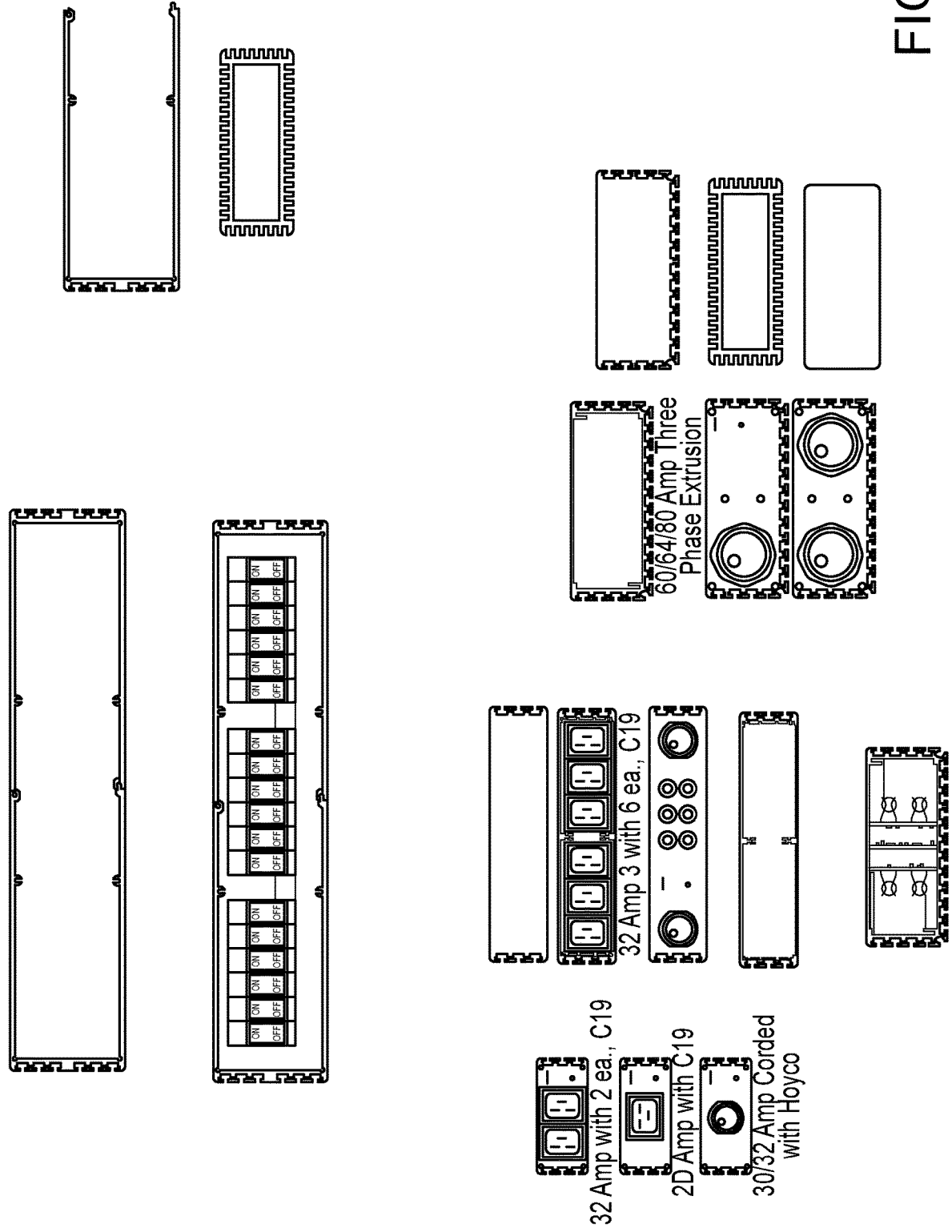
FIG. 22 shows a number of housing or case configurations in accordance with the present invention.

For Current detection, the AC current is passed through the input 616 of a Hall Effect current sense chip 615 where the faint magnetic field 614 is detected across a High Isolation voltage barrier. The Sensed Current output 618 of the Hall Effect magnetic detector 616 is routed to the external measurement electronics. FIG. 18 shows a perspective view of one possible instantiation of a Zonit μATS-INDUSTRIAL. This same form-factor can be used for a Zonit μATS-V2 or other ATS instantiations.

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such or other embodiments and with various modifications required by the particular application(s) or use(s) of the present invention. It is intended that the appended claims be construed to include alternative embodiments to the extent permitted by the prior art.

What is claimed:
1. An automatic transfer switch, comprising:
a first electrical input for receiving power from a first AC power source;
a second electrical input for receiving power from a second AC power source;
an electrical output for outputting power to one or more electrical devices;
a power sense and transfer module for monitoring power delivered by at least one of said first and second electrical inputs and selectively coupling said electrical output to one of said first and second electrical inputs based on said monitoring; and
a preferred source selector configured to enable selection of either one of said first and second electrical inputs as a preferred input for connection to said power output in a default condition, wherein said preferred input is coupled to said electrical output when a signal quality of said preferred input is acceptable and the other one of said first and second electrical inputs is an unpreferred input and is coupled to said electrical output when said signal quality of said preferred input is unacceptable, said preferred source selector being operative to make said selection of said preferred input by one of an automatic selection based on a comparison of power signals provided by said first and second AC power sources and remote control such that said selection of said preferred input can be made free from physically accessing the automatic transfer switch.

2. The automatic transfer switch as set forth in claim 1, wherein said power sense and transfer module is operative to switch between said first and second electrical inputs based on a quality of a power signal delivered via one of said first and second electrical inputs.

3. The automatic transfer switch as set forth in claim 1, wherein said power sense and transfer module is operative to monitor the power signals delivered via the first and second electrical inputs and to connect one of said first and second electrical inputs to said electrical output based on said monitored power signals.

4. The automatic transfer switch as set forth in claim 1, wherein said primary source selector selects said preferred input based on a user input.

5. The automatic transfer switch as set forth in claim 1, wherein said preferred source selector selects said preferred input based on a comparison of power signals delivered via said first and second electrical inputs.

6. The automatic transfer switch as set forth in claim 1, wherein said power sense and transfer module includes a first relay between said first electrical input and said electrical output, and a first solid state switch between said first electrical input and said electrical output, each of said first relay and said first solid state switch being operative for at least one of connecting and disconnecting ("cycling") said first electrical input and said electrical output.

7. The automatic transfer switch as set forth in claim 6, wherein said power sense and transfer module includes a second relay between said second electrical input and said electrical output, and a second solid state switch between said second electrical input and said electrical output, each of said second relay and said second solid state switch being operative for cycling said second electrical input and said electrical output.

8. The automatic transfer switch as set forth in claim 6, wherein said solid state switch is operative for selectively cycling at or near a zero crossing of a power signal.

9. The automatic transfer switch as set forth in claim 1, further comprising a power control for controlling power delivery to a first electrical device based at least in part on an input separate from power signals delivered via said first and second electrical inputs.

10. The automatic transfer switch as set forth in claim 9, wherein said input comprises a user input.

11. The automatic transfer switch as set forth in claim 9, wherein said input comprises an environmental input from an environmental sensor.

12. The automatic transfer switch as set forth in claim 9, wherein said input is a processor input from a processor operative for comparing a parameter related to said first electrical device to a threshold.

13. The automatic transfer switch as set forth in claim 1, further comprising a communications input for receiving an input communications signal for use in controlling the operation of said automatic transfer switch.

14. The automatic transfer switch as set forth in claim 1, further comprising a communications output for transmitting an output communications signal to a remote processing platform.

15. The automatic transfer switch as set forth in claim 14, wherein said output communications signal comprises information concerning a state of one of said automatic transfer switch and a connected piece of electrical equipment.

16. The automatic transfer switch as set forth in claim 1, further comprising a warning indication for providing an indication when a monitored power reaches a predetermined state.

17. A method for delivering power to electrical devices, comprising:
providing an automatic transfer switch including a first electrical input for receiving power from a first AC power source, a second electrical input for receiving power from a second AC power source, an electrical output for outputting power to one or more electrical devices, and a power sense and transfer module for monitoring power delivered by at least one of said first and second electrical inputs and selectively coupling said electrical output to one of said first and second electrical inputs based on said monitoring;
selecting one of said first and second electrical inputs as a preferred input for connection to said power output in a default condition, wherein said preferred input is coupled to said electrical output when a signal quality of said preferred input is acceptable and the other one of said first and second electrical inputs is an unpreferred input and is coupled to said electrical output when said signal quality of said preferred input is unacceptable; and
changing to the other one of said first and second electrical inputs as said preferred input, said changing being one of automatic based on a comparison of power signals provided by said first and second AC power sources and by remote control such that said changing of said preferred input can be made free from physically accessing the automatic transfer switch.

18. The method as set forth in claim 17, further comprising operating said power sense and transfer module to switch between said first and second electrical inputs based on a quality of a power signal delivered via one of said first and second electrical inputs.

19. The method as set forth in claim 17, further comprising operating said power sense and transfer module to monitor the power signals delivered via the first and second electrical inputs and to connect one of said first and second electrical inputs to said electrical output based on said monitored power signals.

20. The method as set forth in claim 17, further comprising operating said primary source selector to select said preferred input based on a user input.

21. The method as set forth in claim 17, further comprising operating said preferred source selector to select said preferred input based on a comparison of power signals delivered via said first and second electrical inputs.

22. The method as set forth in claim 17, wherein said power sense and transfer module includes a first relay between said first electrical input and said electrical output, and a first solid state switch between said first electrical input and said electrical output, and said method further comprising: operating each of said first relay and said first solid state switch for at least one of connecting and disconnecting ("cycling") said first electrical input and said electrical output.

23. The method as set forth in claim 22, wherein said power sense and transfer module includes a second relay between said second electrical input and said electrical output, and a second solid state switch between said second electrical input and said electrical output, and said method further comprises operating each of said second relay and said second solid state switch for cycling said second electrical input and said electrical output.

24. The method as set forth in claim 22, further comprising selectively cycling said solid state switch at or near a zero crossing of a power signal.

25. The method as set forth in claim 17, further comprising controlling power delivery to a first electrical device based at least in part on an input separate from power signals delivered via said first and second electrical inputs.

26. The method set forth in claim 25, wherein said input comprises a user input.

27. The method as set forth in claim 25, wherein said input comprises and environmental input from an environmental sensor.

28. The method as set forth in claim 25, wherein said input is a processor input from a processor operative for comparing a parameter related to said first electrical device to a threshold.

29. The method as set forth in claim 17, further comprising receiving an input communications signal for use in controlling the operation of said automatic transfer switch.

30. The method as set forth in claim 17, further comprising transmitting an output communications signal to a remote processing platform.

31. The method as set forth in claim 30, wherein said output communications signal comprises information concerning a state of one of said automatic transfer switch and a connected piece of electrical equipment.

32. The method as set forth in claim 17, further comprising providing an indication when a monitored power reaches a predetermined state.

* * * * *